(12) United States Patent
Go et al.

(10) Patent No.: US 11,024,615 B2
(45) Date of Patent: Jun. 1, 2021

(54) DISPLAY DRIVER INTEGRATED CIRCUIT DEVICE

(71) Applicant: Samsung Electronics Co., Ltd., Suwon-si (KR)

(72) Inventors: Seung-hee Go, Seongnam-si (KR); Min-hee Uh, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 9 days.

(21) Appl. No.: 16/565,728

(22) Filed: Sep. 10, 2019

(65) Prior Publication Data
US 2020/0294978 A1    Sep. 17, 2020

(30) Foreign Application Priority Data

Mar. 15, 2019  (KR) .................. 10-2019-0030018

(51) Int. Cl.
| | | |
|---|---|---|
| *H01L 25/10* | (2006.01) | |
| *H01L 23/00* | (2006.01) | |
| *G09G 3/20* | (2006.01) | |

(52) U.S. Cl.
CPC ............ *H01L 25/105* (2013.01); *G09G 3/20* (2013.01); *H01L 24/05* (2013.01); *H01L 24/13* (2013.01); *H01L 24/32* (2013.01); *G09G 2310/0267* (2013.01); *G09G 2310/0275* (2013.01); *G09G 2330/028* (2013.01); *H01L 2224/05009* (2013.01); *H01L 2224/32145* (2013.01); *H01L 2225/06541* (2013.01); *H01L 2924/1426* (2013.01)

(58) Field of Classification Search
CPC ....... H01L 25/105; H01L 24/05; H01L 24/13; H01L 24/32; H01L 2224/05009; H01L 2224/32145; H01L 2224/06541; H01L 2924/1426; G09G 3/20; G09G 2310/0267; G09G 2310/0275; G09G 2330/028
See application file for complete search history.

(56) References Cited

U.S. PATENT DOCUMENTS

| | | |
|---|---|---|
| 6,867,073 B1 | 3/2005 | Enquist |
| 7,884,776 B2 | 2/2011 | Mohamadi |
| 7,955,887 B2 | 6/2011 | Assefa et al. |
| 8,889,487 B2 | 11/2014 | Mallikarjunaswamy |
| 9,565,383 B2 | 2/2017 | Sukegawa et al. |
| 9,691,725 B2 | 6/2017 | Chang et al. |

(Continued)

*Primary Examiner* — Peter D McLoone
(74) *Attorney, Agent, or Firm* — Muir Patent Law, PLLC

(57) ABSTRACT

A display driver integrated circuit (IC) device includes a first substrate having a first front surface and a first back surface; a first interlayer insulating layer on the first front surface; a wiring layer in the first interlayer insulating layer; a first bonding insulating layer on the first interlayer insulating layer; a second substrate having a second front surface and a second back surface, the second front surface being disposed toward the first front surface; a second interlayer insulating layer on the second front surface a second bonding insulating layer on the second interlayer insulating layer and physically bonded to the first bonding insulating layer; and a back via stack structure penetrating the second substrate, the second interlayer insulating layer, the second bonding insulating layer, the first bonding insulating layer, and the first interlayer insulating layer and electrically connected to the wiring layer.

18 Claims, 18 Drawing Sheets

(56) References Cited

U.S. PATENT DOCUMENTS

| | | |
|---|---|---|
| 10,056,353 B2 | 8/2018 | Tsai et al. |
| 10,157,951 B2 | 12/2018 | Kim et al. |
| 10,170,450 B2 | 1/2019 | Beyne et al. |
| 2017/0154873 A1* | 6/2017 | Kim ........................ H01L 24/17 |
| 2018/0151522 A1 | 5/2018 | Yang et al. |
| 2018/0240797 A1 | 8/2018 | Yokoyama et al. |

* cited by examiner

DISPLAY DRIVER INTEGRATED CIRCUIT DEVICE

CROSS-REFERENCE TO RELATED APPLICATION

This application claims the benefit of Korean Patent Application No. 10-2019-0030018, filed on Mar. 15, 2019, in the Korean Intellectual Property Office, the disclosure of which is incorporated herein in its entirety by reference.

BACKGROUND

The inventive concept relates to an integrated circuit (IC) device, and more particularly, to a display driver IC device.

Many electronic devices include a display panel that displays an image. A display driver integrated circuit (DDI) device may be connected to the display panel to drive the display panel.

The display driver IC device may receive image data from outside and perform image processing on the received image data. The display driver IC device may drive the display panel by applying an image signal to the display panel based on the image data on which image processing is performed. As the performance of the display panel is improved, the size of the display driver IC device increases and a wiring process becomes difficult during manufacturing.

SUMMARY

The inventive concept provides a display driver integrated circuit (IC) device capable of reducing the size thereof and facilitating a wiring process during manufacturing.

According to an aspect of the inventive concept, there is provided a display driver integrated circuit (IC) device including a first substrate having a first front surface and a first back surface opposite to the first front surface; a first interlayer insulating layer on the first front surface; a first wiring layer in the first interlayer insulating layer; a first bonding insulating layer on the first interlayer insulating layer; a second substrate having a second front surface and a second back surface opposite to the second front surface, the second front surface being disposed toward the first front surface; a second interlayer insulating layer on the second front surface; a second bonding insulating layer on the second interlayer insulating layer and physically bonded to the first bonding insulating layer; a back via stack structure penetrating the second substrate, the second interlayer insulating layer, the second bonding insulating layer, the first bonding insulating layer, and the first interlayer insulating layer and electrically connected to the first wiring layer; and a connection terminal on the back via stack structure on the second back surface and electrically connected to the back via stack structure.

According to another aspect of the inventive concept, there is provided a display driver integrated circuit (IC) device including a first substrate having a first front surface and a first back surface opposite to the first front surface; a first interlayer insulating layer on the first front surface; a first wiring layer in the first interlayer insulating layer; a first bonding insulating layer on the first interlayer insulating layer; a second substrate having a second front surface and a second back surface opposite to the second front surface, the second front surface being disposed toward the first front surface; a second interlayer insulating layer on the second front surface; a second bonding insulating layer on the second interlayer insulating layer and physically bonded to the first bonding insulating layer; a back via stack structure including a back via hole penetrating the second substrate, the second interlayer insulating layer, the first and second bonding insulating layers, and the first interlayer insulating layer, a metal layer inside the back via hole and on the second back surface, and a passivation layer embedded in the back via hole and electrically connected to the first wiring layer; and a connection terminal including a conductive pad and a conductive bump formed on the conductive pad and electrically connected to the back via stack structure. The conductive pad is formed on the metal layer on the second back surface.

According to another aspect of the inventive concept, there is provided a display driver integrated circuit (IC) device including a first substrate having a first front surface and a first back surface opposite to the first front surface; a first interlayer insulating layer on the first front surface; a wiring layer in the first interlayer insulating layer; a second substrate having a second front surface corresponding to the first front surface and a second back surface opposite to the second front surface; a second interlayer insulating layer on the second front surface; a bonding insulating layer disposed between the first interlayer insulating layer of the first substrate and the second interlayer insulating layer of the second substrate and bonding the first substrate to the second substrate; a plurality of connection terminals spaced apart from each other in a flat manner on the second back surface of the second substrate; and a back via stack structure electrically connected to the plurality of connection terminals, vertically penetrating the second substrate, the second interlayer insulating layer, the bonding insulating layer, and the first interlayer insulating layer, and electrically connected to the wiring layer.

BRIEF DESCRIPTION OF THE DRAWINGS

Embodiments of the inventive concept will be more clearly understood from the following detailed description taken in conjoint with the accompanying drawings in which.

DETAILED DESCRIPTION OF THE EMBODIMENTS

Figure 1:
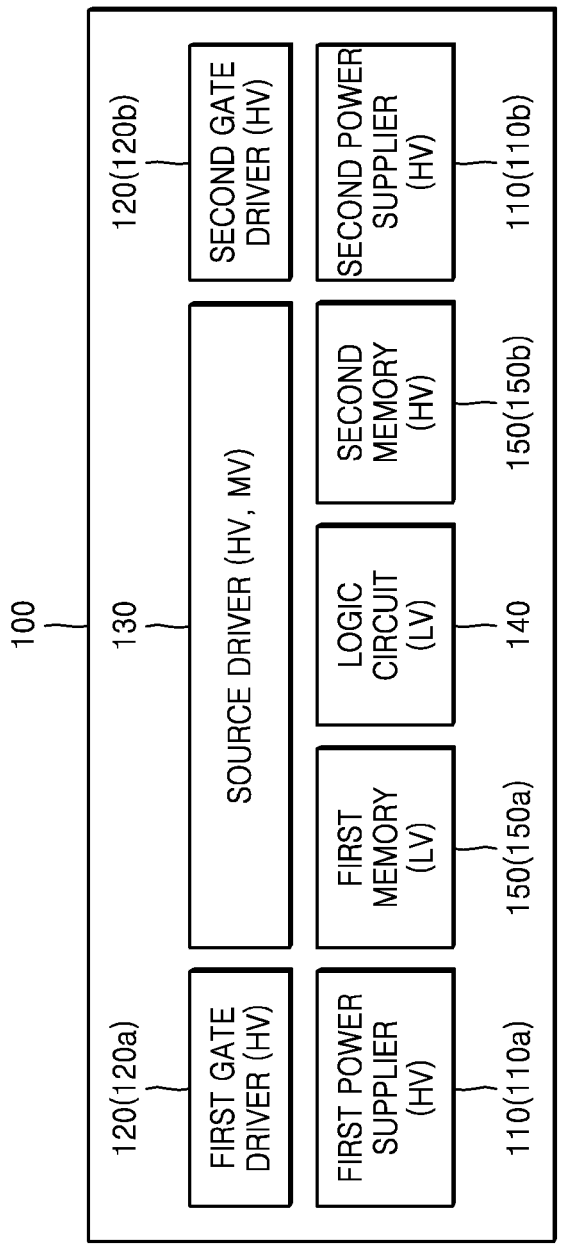
FIG. 1 is a diagram showing a configuration of a display driver integrated circuit (IC) device according to an embodiment of the inventive concept.

FIG. 1 is a diagram showing a configuration of a display driver integrated circuit (IC) device 100 according to an embodiment of the inventive concept.

Specifically, the display driver IC device 100 may include circuit functional blocks, i.e., a power supplier 110, a gate driver 120, a source driver 130, a logic circuit 140, and a memory 150. In an embodiment, the power supplier 110 may include a plurality of power suppliers, e.g., a first power supplier 110*a* and a second power supplier 110*b*.

As used herein, the display driver IC device 100 may comprise a package which may include one or more chips stacked on a package substrate.

The power supplier 110 may control the gate driver 120, the source driver 130, and the memory 150 by applying power, for example, a voltage, to the gate driver 120, the source driver 130, and the memory 150. The power supplier 110 may include a high voltage transistor HV.

In an embodiment, the gate driver 120 may include a plurality of gate drivers, e.g., a first gate driver 120*a* and a second gate driver 120*b*. The gate driver 120 may control a gate line of a display panel. If necessary, the gate driver 120 may not be included in the display driver IC device 100 but may be installed or included in the display panel. The gate driver 120 may include an analog circuit. The gate driver 120 may include a high voltage transistor HV.

The source driver 130 may control a source line of the display panel. The source driver 130 may include an analog circuit. The source driver 130 may include a high voltage transistor HV and a medium voltage transistor MV.

The logic circuit 140 may include a logic circuit that processes data for controlling the power supplier 110, the gate driver 120, the source driver 130, and the memory 150. The logic circuit 140 may include a low voltage transistor LV.

The memory 150 may include a memory that stores data for controlling the power supplier 110, the gate driver 120, and the source driver 130. In an embodiment, the memory 150 may include a plurality of memories, for example, a first memory 150*a* and a second memory 150*b*. The first memory 150*a* may include a low voltage transistor LV. The first memory 150*a* may include a MOS transistor used in dynamic random access memory (DRAM) or enhanced static random access memory (ESRAM). The second memory 150*b* may include a high voltage transistor HV. The second memory 150*b* may include a MOS transistor used in flash memory.

In this specification, the low voltage transistor LV, the medium voltage transistor MV, and the high voltage transistor HV may include MOS transistors. In this specification, the low voltage transistor LV, the medium voltage transistor MV, and the high voltage transistor HV may be classified by a thickness of a gate insulating layer of each of the MOS transistors.

For example, the low voltage transistor LV may mean that the thickness of the gate insulating layer is the smallest, and the medium voltage transistor MV and the high voltage transistor HV may mean that the thickness of the gate insulating layer is greater than that of the low voltage transistor LV. The medium voltage transistor MV and the high voltage transistor HV may be collectively referred to as a high voltage transistor when compared with the low voltage transistor LV.

In an embodiment, the low voltage transistor LV may have the thickness of a gate insulating layer of 70 Å or less, for example, 50 Å to 70 Å, the medium voltage transistor MV may have the thickness of a gate insulating layer of more than 70 Å to 300 Å or less, and the high voltage transistor HV may have the thickness of a gate insulating layer of more than 300 Å, for example, 300 Å to 800 Å.

In this specification, the low voltage transistor LV, the medium voltage transistor MV, and/or the high voltage transistor HV may be classified by a voltage applied to a source electrode, a gate electrode, and/or a drain electrode.

For example, the low voltage transistor LV may mean that the voltage applied to the source electrode, the gate electrode, and/or the drain electrode is small, and the medium voltage transistor MV and the high voltage transistor HV may mean that the voltage applied to the source electrode, the gate electrode, and/or the drain electrode is higher than that of the low voltage transistor LV. The medium voltage transistor MV and the high voltage transistor HV may be collectively referred to as a high voltage transistor when compared with the low voltage transistor LV.

In an embodiment, a low voltage, e.g., 3 V or less, may be applied to the source electrode, the gate electrode, and/or the drain electrode of the low voltage transistor LV. A voltage of more than 3 V to less than 9 V, may be applied to the source electrode, the gate electrode, and/or the drain electrode of the medium voltage transistor MV. A high voltage, for example, 9 V or more to 30 V or less, may be applied to the source electrode, the gate electrode, and/or the drain electrode of the high voltage transistor HV.

Figure 2:
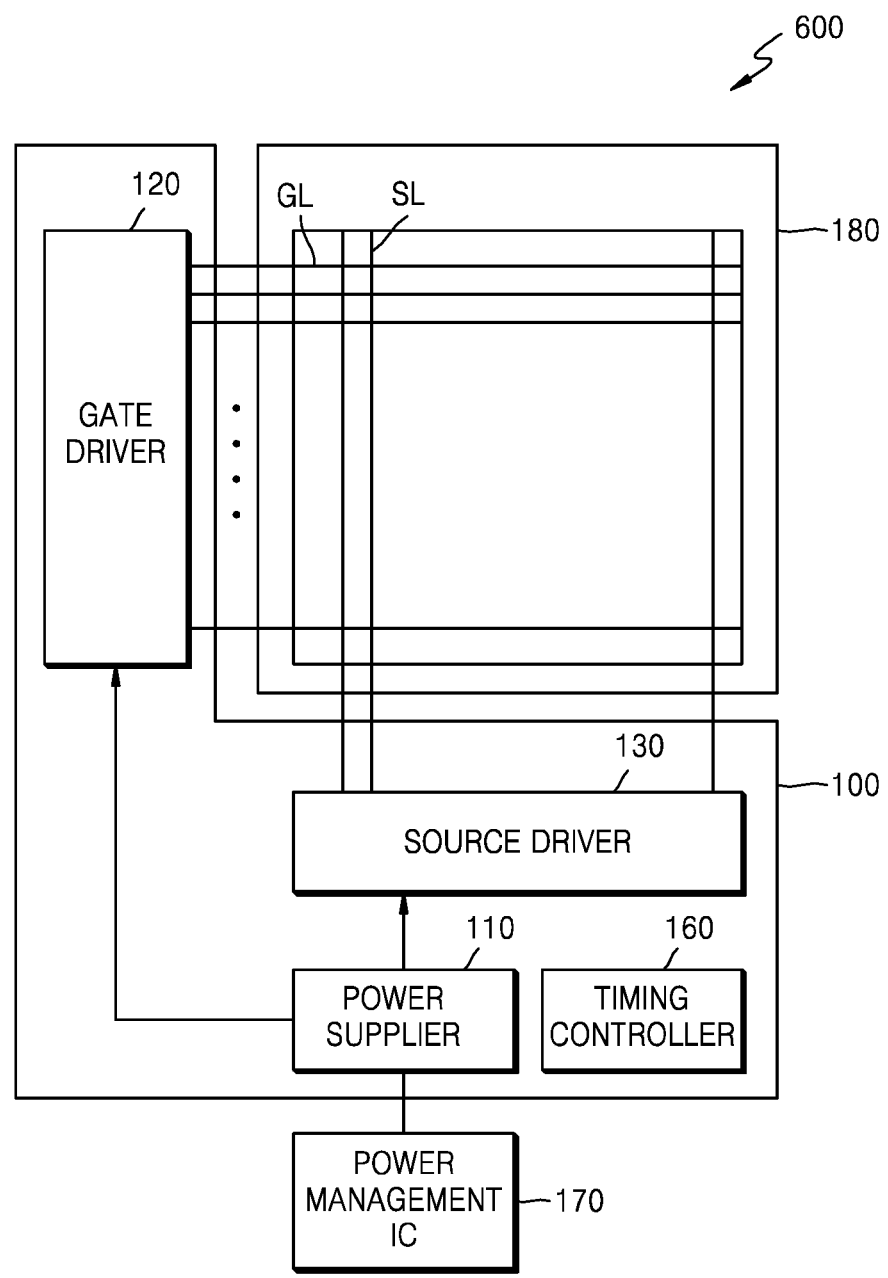
FIG. 2 is a diagram illustrating a display module including a display driver IC device according to an embodiment of the inventive concept.

FIG. 2 is a diagram illustrating a display module 600 including the display driver IC device 100 according to an embodiment of the inventive concept.

Specifically, in the description of FIG. 2, the same reference numerals as in FIG. 1 may be the same components. The display module 600 may include a display panel 180, the display driver IC device 100, and a power management IC 170. The display panel 180 may include a flat display panel or a flexible display panel.

The display panel 180 may include a plurality of pixels arranged in a matrix and may display an image in frame units. Each pixel may be a position where a pair of a gate line GL and a source line SL cross each other among a plurality of gate lines GL arranged in a row direction and a plurality of source lines SL arranged in a column direction.

The display panel 180 may include one of a liquid crystal display (LCD), a light emitting diode (LED) display, an organic LED (OLED) display, an active-matrix OLED (AMOLED) display, an electrochromic display (ECD), a digital mirror device (DMD), an actuated mirror device (AMD), a grating light value (GLV) display, a plasma display panel (PDP), an electro luminescent display (ELD), and a vacuum fluorescent display (VFD). The display panel 180 may display image data at a resolution of a wide video graphics array (WVGA), or higher, for example, a high definition (HD), full HD (FHD), wide quad HD (WQHD) resolution, etc.

The display panel 180 may be driven by the display driver IC device 100. The gate driver 120 included in the display driver IC device 100 may transmit a voltage and a signal for driving the gate line GL to the display panel 180. In an embodiment, unlike FIG. 2, the gate driver 120 may be located in the display panel 180, rather than in the display driver IC device 100. Alternatively, the gate driver 120 may include one independent chip different from that of FIG. 2.

The display driver IC device 100 may receive external power from the power management IC 170. The display driver IC device 100 may generate a driving signal for displaying image data applied from outside on the display panel 180. To this end, the display driver IC device 100 may include a timing controller 160, the source driver 130, and the power supplier 110.

The timing controller 160 may receive image data and a signal for driving the image data from an external device (for example, a host device (not shown)) and may control the source driver 130 based on the received signals. The timing controller 160 may also convert a format of the image data received from outside into a format suitable for an interface specification with the source driver 130 and provide the converted image data to the source driver 130.

The source driver 130 may drive the pixels of the display panel 180 under the control of the timing controller 160. The source driver 130 may supply a voltage corresponding to the image data to the plurality of source lines SL of the display panel 180. To this end, the source driver 130 may use a positive power voltage and a negative power voltage, which are external power supplied from the power management IC 170, as a power voltage.

The gate driver 120 may supply gate voltages (a gate high voltage and a gate low voltage) to the gate line GL of the display panel 180 under the control of the timing controller 160. The gate driver 120 may control the activation of the gate line GL by the gate high voltage and the gate low voltage applied from the power supplier 110.

The power supplier 110 may boost external power supplied from the power management IC 170 to internal power. The external power may be a positive power voltage or a negative power voltage. The power supplier 110 may boost the positive power voltage or the negative power voltage to the gate high voltage or the gate low voltage and provide the boosted voltage to the gate driver 120. Alternatively, the power supplier 110 may provide the source driver 130 with the positive power voltage or the negative power voltage.

In addition, although not shown, the display driver IC device 100 may further include an interface. The display driver IC device 100 may communicate with an external device via the interface. The interface may include one of, for example, an RGB interface, a CPU interface, a serial interface, an MDDI (mobile display digital interface), an I2C (inter integrated circuit) interface, SPI (serial peripheral interface), MCU (micro controller unit) interface, an MIPI (mobile industry processor interface), an eDP (embedded displayport) interface, D-sub (D-subminiature), an optical interface, and a HDMI (high definition multimedia interface).

Additionally or alternatively, the interface may include, for example, an MHL (mobile high-definition link) interface, an SD (secure digital) card/MMC (multi-media card) interface or an IrDA (infrared data association) specification interface. In addition, the interface may include various other serial or parallel interfaces.

The power management IC 170 may supply a power voltage as a power device for generating a predetermined voltage. For example, the power management IC 170 may apply a positive power voltage and a negative power voltage to the display driver IC device 100.

Figure 3:
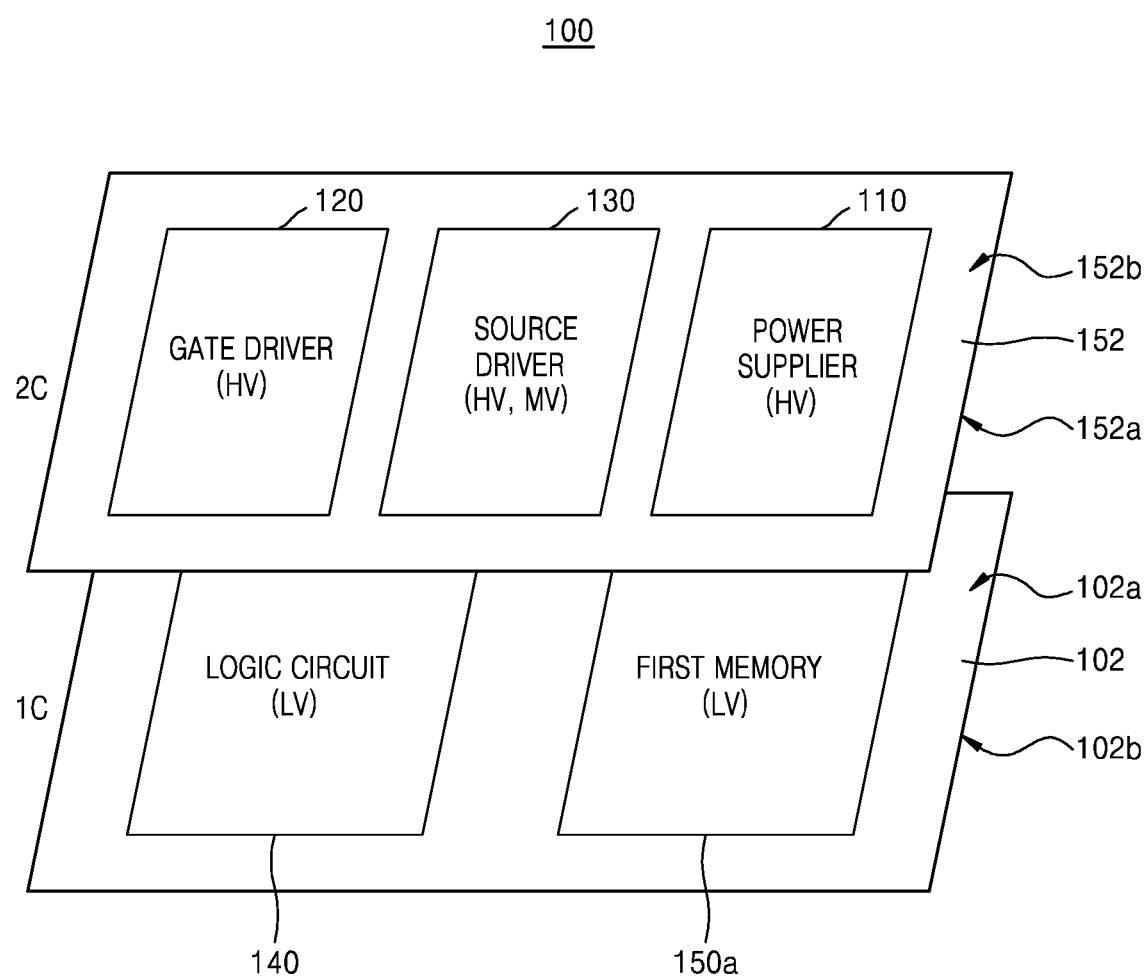
FIG. 3 is an exploded view illustrating a laminated structure of a display driver IC device according to an embodiment of the inventive concept.

FIG. 3 is an exploded view illustrating a laminated structure of the display driver IC device 100 according to an embodiment of the inventive concept.

Specifically, in FIG. 3, the same reference numerals as those in FIGS. 1 and 2 denote the same components, and the same descriptions are briefly provided or omitted for the sake of convenience. As shown in FIG. 3, the display driver IC device 100 provides components shown in FIGS. 1 and 2 on a first substrate 102 and a second substrate 152. Each of the first substrate 102 and the second substrate 152 may be provided from a wafer, such as a silicon wafer.

The display driver IC device 100 may include the second substrate 152 stacked on the first substrate 102. The first substrate 102 may include a first front surface 102a and a first back surface 102b opposite to the first front surface 102a. The logic circuit 140 and the first memory 150a may be implemented on the first substrate 102. Hereinafter, "implemented on a substrate" may also mean either "implemented in the substrate," or "provided with the substrate." The logic circuit 140 and the first memory 150a may include the low voltage transistor LV. The logic circuit 140 and the first memory 150a implemented on the first substrate 102 may constitute a first chip 1C. The first chip 1C may be provided from a wafer.

The second substrate 152 may include a second front surface 152a and a second back surface 152b opposite to the second front surface 152a. The second front surface 152a of the second substrate 152 may be positioned corresponding to the first front surface 102a of the first substrate 102. The gate driver 120, the source driver 130, and the power supplier 110 may be implemented on the second substrate 152, that is, on the second front surface 152a of the second substrate 152.

The gate driver 120 and the power supplier 110 may include the high voltage transistor HV. The source driver 130 may include the medium voltage transistor MV and the high voltage transistor HV. The gate driver 120, the source driver 130 and the power supplier 110 implemented on the second substrate 152 may constitute a second chip 2C. The second chip 2C may be provided from a wafer.

The first chip 1C including the first substrate 102 and the second chip 2C including the second substrate 152 may be provided from a different wafer. For example, in one embodiment, the first chip 1C is provided from a first wafer and the second chip 2C is provided from a second wafer different from the first wafer.

The first chip 1C implemented on the first substrate 102 and the second chip 2C implemented on the second substrate 152 may be electrically connected to each other by a back via stack structure as will be described later. A connection terminal may be provided on the back via stack structure.

In the display driver IC device 100 of the inventive concept, the logic circuit 140 or the first memory 150a, which uses the low voltage transistor LV, may be implemented on the first substrate 102, and the gate driver 120, the source driver 130, and the power supplier 110, which use the high voltage transistor HV or the medium voltage transistor MV, may be implemented on the second substrate 152.

As the performance of a display panel is improved, the areas of the logic circuit 140 and the first memory 150a in the display driver IC device 100 become large and a wiring process may become difficult. Accordingly, the display driver IC device 100 of the inventive concept may form the logic circuit 140 and the first memory 150a of the first substrate 102 separate from the second substrate 152. As a result, the display driver IC device 100 of the inventive concept may reduce its size and facilitate the wiring process during manufacture.

Figure 4:
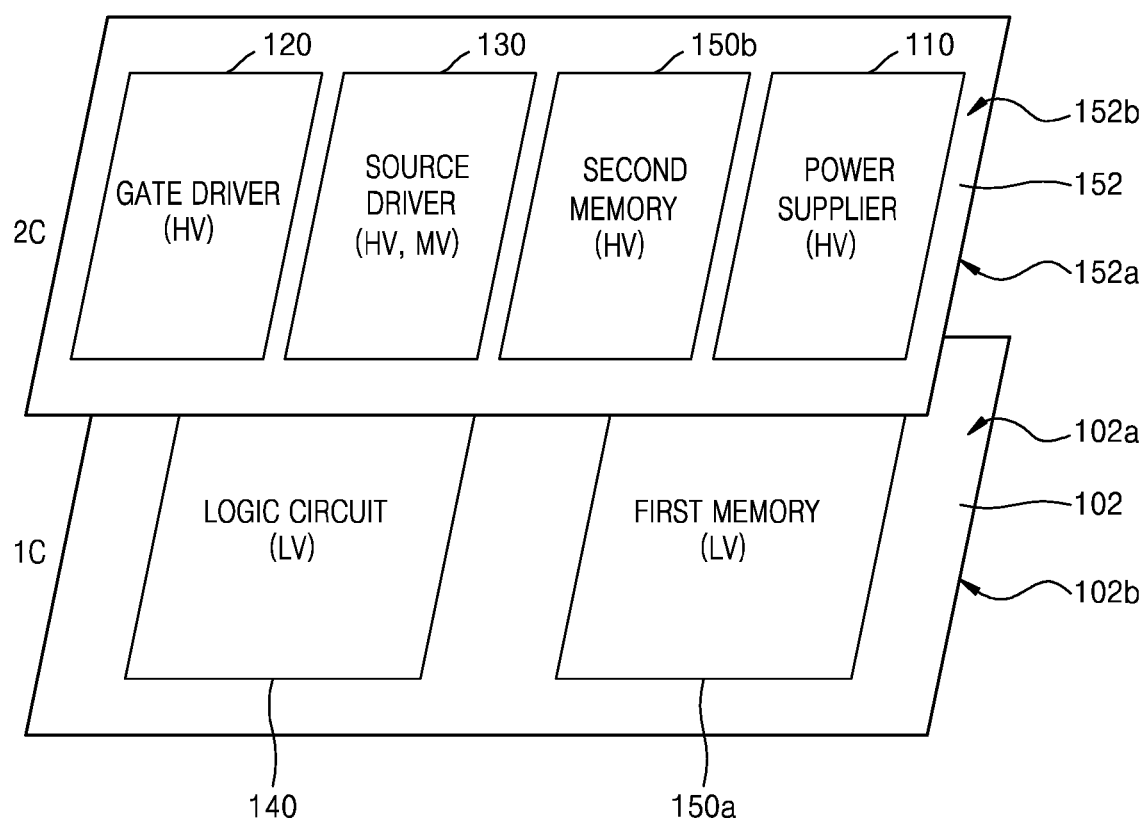
FIG. 4 is an exploded view illustrating a laminated structure of a display driver IC device according to an embodiment of the inventive concept.

FIG. 4 is an exploded view illustrating a laminated structure of a display driver IC device 100-1 according to an embodiment of the inventive concept.

More specifically, the display driver IC device 100-1 of FIG. 4 may be the same as the display driver IC device 100 of FIG. 3 except that the second memory 150b is formed with the second substrate 152. In FIG. 4, the same reference numerals as in FIG. 3 denote the same components, and the same descriptions are briefly provided or omitted for convenience.

The display driver IC device 100-1 may be implemented with the gate driver 120, the source driver 130, a second memory 150b, and the power supplier 110 on the second substrate 152. The second memory 150b may include a high voltage transistor HV. The gate driver 120, the source driver 130, the second memory 150b and the power supplier 110 implemented on the second substrate 152 may constitute the second chip 2C.

The display driver IC device 100-1 may reduce its size and facilitate a wiring process during manufacture and may include the second memory 150b to increase the data storage capacity, thereby driving the display panel more quickly.

Figure 5:
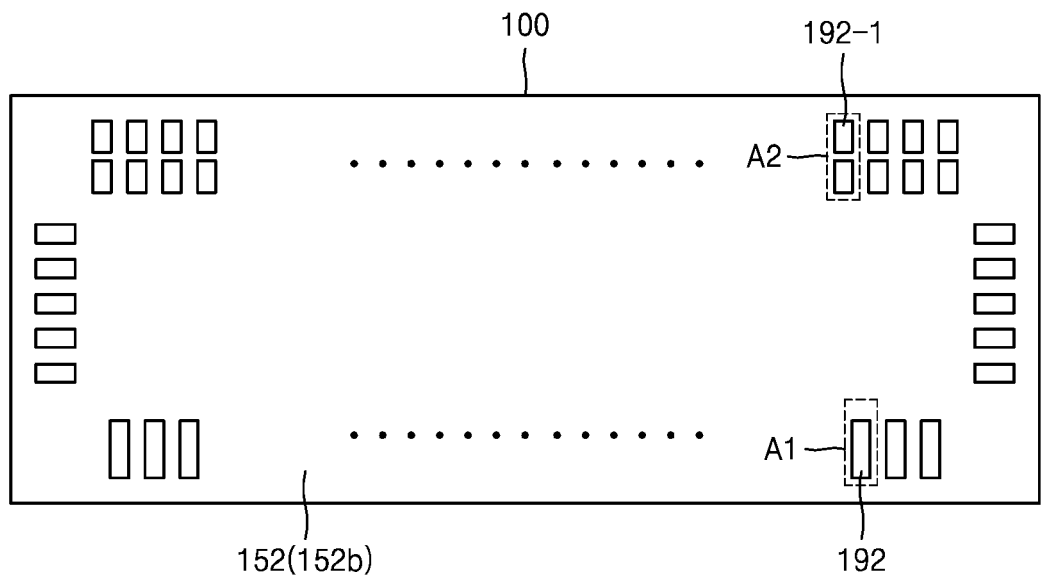
FIG. 5 is a top plan view of a display driver IC device according to an embodiment of the inventive concept.

FIG. 5 is a top plan view of the display driver IC device 100 according to an embodiment of the inventive concept.

Specifically, FIG. 5 is a diagram for explaining the arrangement of connection terminals 192 and 192-1 of the display driver IC device 100. The display driver IC device 100 may be arranged with the plurality of connection terminals 192 and 192-1 spaced from each other in a flat manner on the second back surface 152b of the second substrate 152.

The connection terminals 192 may be arranged in one row along the edge of the second back surface 152b. The connection terminals 192-1 may be arranged in two rows along the edge of the second back surface 152b. The arrangement of the connection terminals 192 and 192-1 may be variously configured differently from that of FIG. 5.

Figure 6A:
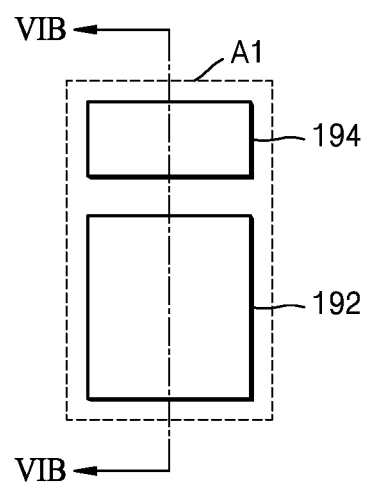
FIG. 6A is an enlarged plan view of region A1 of FIG. 5 according to example embodiments.
Figure 6B:
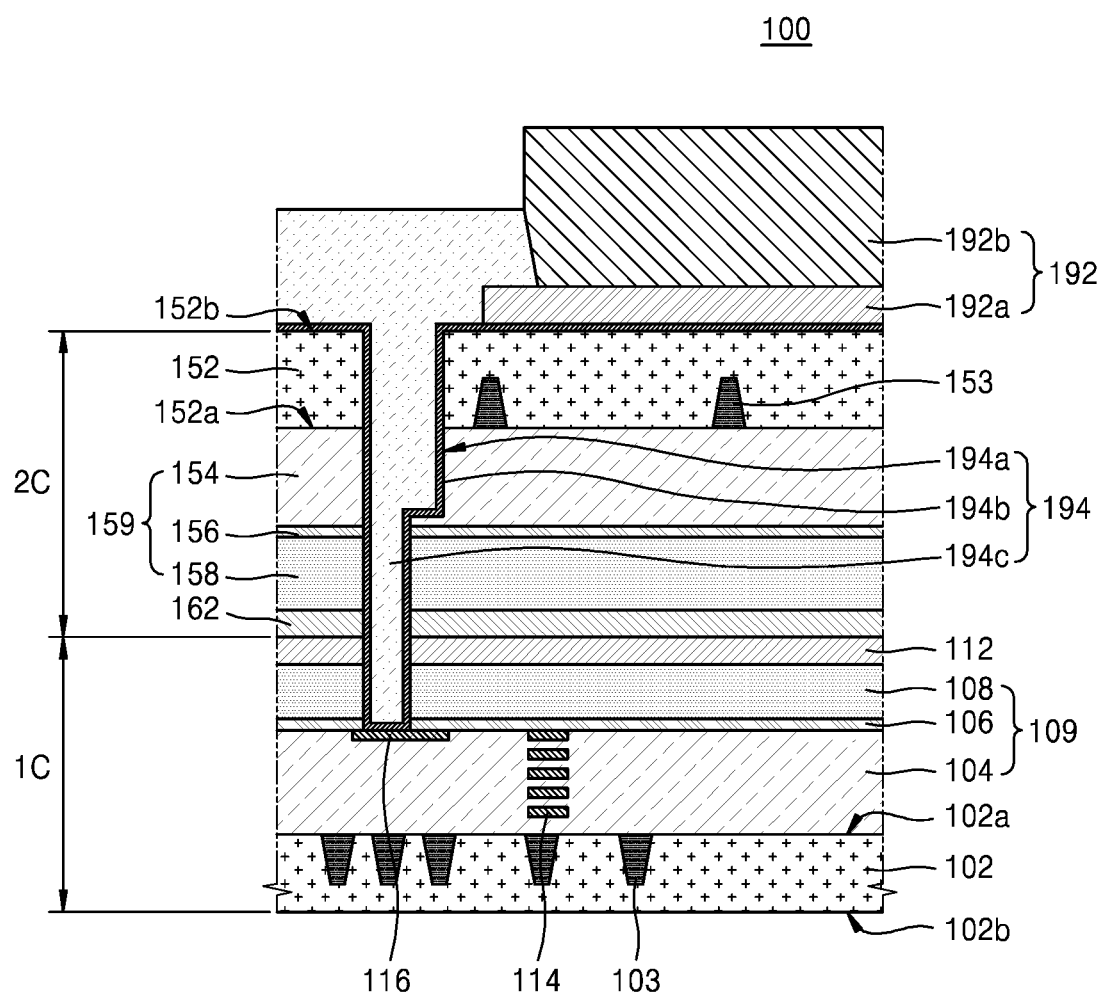
FIG. 6B is a vertical sectional view taken along line VIB-VIB of FIG. 6A according to example embodiments.

FIG. 6A is an enlarged plan view of region A1 of FIG. 5 according to example embodiments. FIG. 6B is a vertical sectional view taken along line VIB-VIB of FIG. 6A according to example embodiments.

Specifically, FIG. 6A is an enlarged view of the connection terminal 192 of FIG. 5 and the region A1 that is one side part of the connection terminal 192. As shown in FIG. 6A, a back via stack structure (BVS) 194 may be positioned adjacent to one side of the connection terminal 192. The connection terminal 192 and the BVS 194 may be electrically connected using a metal layer as will be described later.

FIG. 6B is a cross-sectional view of a vertical structure of the display driver IC device 100 including a vertical structure of the connection terminal 192 and the BVS 194. As shown in FIG. 6B, the display driver IC device 100 may include the first substrate 102 including the first front surface 102a and the first back surface 102b opposite to the first front surface 102a. A device isolation layer 103 may be formed in the first substrate 102. Wiring layers electrically insulated by a first interlayer insulating layer 109 may be formed on the first front surface 102a.

The first interlayer insulating layer 109 may include a first insulating layer 104, a second insulating layer 106, and a third insulating layer 108. The first insulating layer 104, the second insulating layer 106, and the third insulating layer 108 may include a silicon oxide layer or a silicon nitride layer. In an embodiment, the second insulating layer 106, e.g., the silicon nitride layer, may be referred to as an etch prevention layer as a layer of material having a higher etch selectivity relative to the first and third insulating layers 104 and 108, e.g., the silicon oxide layer.

The wiring layers may include a contact wiring layer 116 and a connection wiring layer 114. The contact wiring layer 116 may include a wiring that contacts the BVS 194, as will be described below. The connection wiring layer 114 may include a connection wiring for connecting individual devices on the first substrate 102.

A first bonding insulating layer 112 may be formed on the first interlayer insulating layer 109. The first bonding insulating layer 112 may include a bonding layer which is bonded to a second bonding insulating layer 162 as will be described later. The first bonding insulating layer 112 may include a silicon oxide layer. The first interlayer insulating layer 109, the wiring layers 114 and 116, and the first bonding insulating layer 112 formed on the first front surface 102a of the first substrate 102 may constitute the first chip 1C. In some examples, the first chip 1C may not include the first bonding insulating layer 112. In this case, the third insulating layer 108 of the first chip 1C may bond to the second bonding insulating layer 162 of the second chip 2C.

Although not shown in FIG. 6B, the logic circuit 140 and the first memory 150a may be implemented on the first substrate 102 as described above. For example, the first chip 1C may include the logic circuit 140 and the first memory 150a implemented on the first substrate 102. For example, the first chip 1C may include the first substrate 102 provided with the logic circuit 140 and the first memory 150a.

The display driver IC device 100 may include the second substrate 152 having the second front surface 152a and the second back surface 152b opposite to the second front surface 152a in which the second front surface 152a is positioned toward the first front surface 102a. The device isolation layer 153 may be formed in the second substrate 152. A second interlayer insulating layer 159 may be formed on the second front surface 152a.

Although not shown in FIG. 6B, second wiring layers electrically insulated by the second interlayer insulating layer 159 may be formed on the second front surface 152a. The second wiring layers may include a second contact wiring layer (164 as shown in FIG. 7B) and a second connection wiring layer (not shown). The second contact wiring layer may include a wiring that contacts the BVS 194, as will be described below. The second connection wiring layer may include a connection wiring for connecting individual devices implemented on the second substrate 152.

The second interlayer insulating layer 159 may include a fourth insulating layer 154, a fifth insulating layer 156, and a sixth insulating layer 158. The fourth insulating layer 154, the fifth insulating layer 156, and the sixth insulating layer 158 may include a silicon oxide layer or a silicon nitride layer. In an embodiment, the fifth insulating layer 156, e.g., the silicon nitride layer, may be referred to as an etch prevention layer as a layer of material having a higher etch selectivity relative to the fourth insulating layer 154 and the sixth insulating layer 158, e.g., the silicon oxide layer.

A second bonding insulating layer 162 bonded to the first bonding insulating layer 112 may be formed on the second interlayer insulating layer 159. The second bonding insulating layer 162 may include a silicon oxide layer. The second interlayer insulating layer 159 and the second bonding insulating layer 162 formed on the second front surface 152a of the second substrate 152 may constitute the second chip 2C. In some examples, the second chip 2C may not include the second bonding insulating layer 162. In this case, the sixth insulating layer 158 of the second chip 2C may bond to the first bonding insulating layer 112 of the first chip 1C.

Although not shown in FIG. 6B, the gate driver 120, the source driver 130, the power supplier 110, and/or the second memory 150b may be implemented on the second substrate 152 as described above. For example, the second chip 2C may include the gate driver 120, the source driver 130, the power supplier 110, and/or the second memory 150b implemented on the second substrate 152.

The display driver IC device 100 may include the BVS 194 penetrating the second substrate 152, the second interlayer insulating layer 159, the second bonding insulating layer 162, the first bonding insulating layer 112, and the first interlayer insulating layer 109 and electrically connected to the contact wiring layer 116. The BVS 194 may include a back via hole 194a penetrating the second substrate 152, the second interlayer insulating layer 159, the second bonding insulating layer 162, the first bonding insulating layer 112, and the first interlayer insulating layer 109, a metal layer 194b formed on the inside of the back via hole 194a and on the second back surface 152b, and a passivation layer 194c embedded in the back via hole 194a on the metal layer 194b.

The back via hole 194a may be a via hole penetrating from the second back surface 152b of the second substrate 152 toward the first front surface 102a of the first substrate 102. After the back via hole 194a is formed, the metal layer 194b may be continuously and integrally formed inside the back via hole 194a and may be conformally formed on surfaces of the back via hole 194a. Thus, the BVS 194 may extend continuously along a straight vertical line from the second back surface 152b of the second substrate 152 toward the first front surface 102a of the first substrate 102. A width of the back via hole 194a may be large on the second back surface 152b side of the second substrate 152 and small on the first front surface 102a side of the first substrate 102. The metal layer 194b may include a metal material, such as tungsten. The passivation layer 194c may include a silicon nitride layer.

The display driver IC device 100 may include the connection terminal 192 formed on the BVS 194. For example, the connection terminal 192 may be formed on the metal layer 194b of the BVS 194. The connection terminal 192 may be electrically connected to the BVS 194 on the second back surface 152b. The connection terminal 192 may include a conductive pad 192a and a conductive bump 192b formed on the conductive pad 192a.

The conductive pad 192a may include a metal pad. The metal pad may include an Al pad, an Al—Cu pad, or the like. The conductive bump 192b may include a solder bump or a metal bump. The solder bump may include an SnPb bump, an SnAg bump, or the like. The metal bump may include an Au bump, an Ni—Au bump, or the like. The connection terminal 192 may be insulated by the passivation layer 194c. For example, a portion of the connection terminal 192 may be insulated by the passivation layer 194c.

In the display driver IC device 100 of the inventive concept described above, the connection terminal 192 on the second substrate 152 may be electrically connected to the contact wiring layer 116 of the first substrate 102. Accordingly, in the display driver IC device 100 of the inventive concept, the gate driver 120, the source driver 130, and the power supplier 110 of FIGS. 1, 3, and 4, and/or the second memory 150b of FIGS. 1 and 4 implemented on the front surface of the second substrate 152 may be electrically connected to the logic circuit 140 and the first memory 150a of FIGS. 1, 3, and 4 by the BVS 194.

Figure 7A:
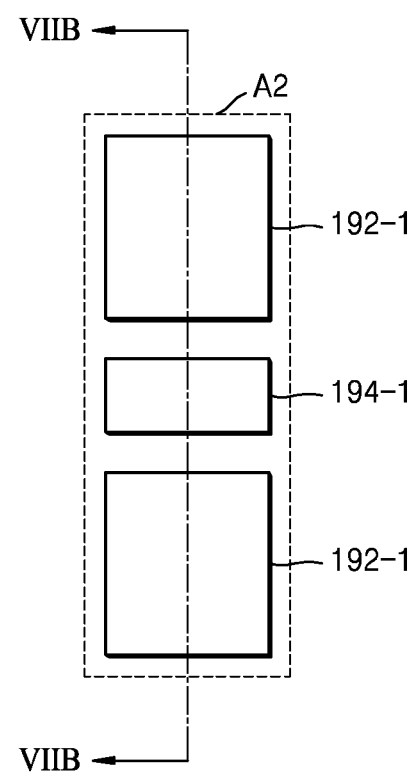
FIG. 7A is an enlarged plan view of region A2 of FIG. 5 according to example embodiments.
Figure 7B:
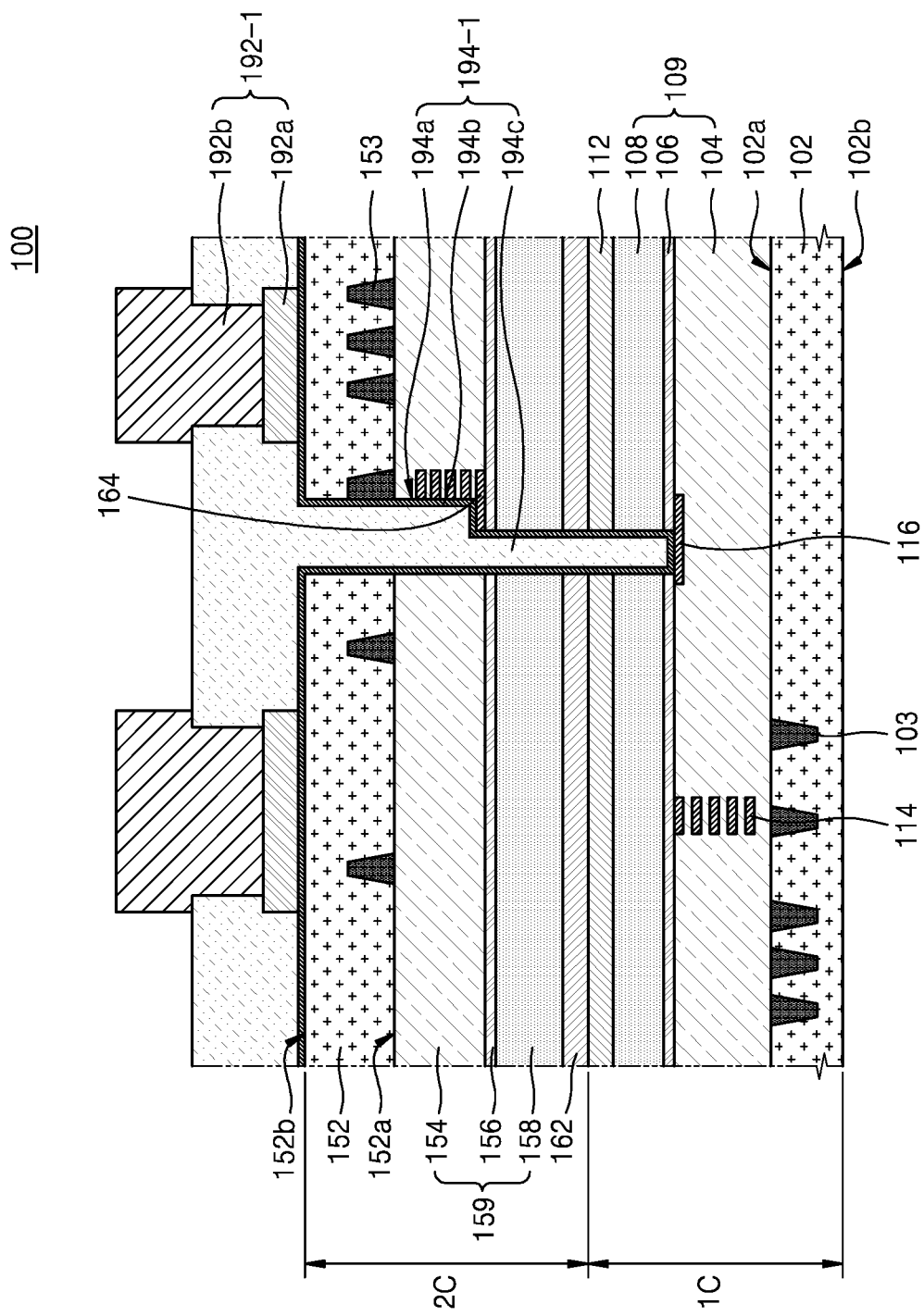
FIG. 7B is a vertical sectional view taken along line VIIB-VIIB of FIG. 7A according to example embodiments.

FIG. 7A is an enlarged plan view of region A2 of FIG. 5 according to example embodiments. FIG. 7B is a vertical sectional view taken along line VIIB-VIIB of FIG. 7A according to example embodiments.

Specifically, in FIGS. 7A and 7B, the same reference numerals as those in FIGS. 6A and 6B denote the same components, and the same descriptions are briefly provided or omitted for the sake of convenience. FIG. 7A is an enlarged view of the connection terminals 192-1 of FIG. 5 and the region A2 between the connection terminals 192-1. As shown in FIG. 7A, a BVS 194-1 may be between the connection terminals 192-1. The connection terminals 192-1 and the BVS 194-1 may be electrically connected using a metal layer 194b as will be described later.

FIG. 7B is a cross-sectional view of a vertical structure of the display driver IC device 100 including the connection terminals 192-1 and the BVS 194-1. FIG. 7B may be the same as FIG. 6B except that the BVS 194-1 is formed between the connection terminals 192-1 and a second contact wiring layer 164 of second wiring layers of the second chip 2C and the contact wiring layer 116 of the first chip 1C are electrically connected to each other by the BVS 194-1.

More specifically, the first chip 1C may be provided with the wiring layers 114 and 116 formed on the first front surface 102a of the first substrate 102 and electrically insulated by the first interlayer insulating layer 109. The wiring layers 114 and 116 may include the contact wiring layer 116 and the connection wiring layer 114. The contact wiring layer 116 and the connection wiring layer 114 may be or may not be electrically connected to each other. The second chip 2C may be provided with the second wiring layers formed on the second front surface 152a of the second substrate 152 and insulated by the second interlayer insulating layer 159. The second wiring layers may include the contact wiring layer 164 and a second connection wiring layer (not shown). The second connection wiring layer may include a connection wiring for connecting individual devices implemented on the second substrate 152. The second wiring layers may include a plurality of metal layers.

In example embodiments, the second contact wiring layer 164 may include one or more metal layers connected to the BVS 194-1 to improve the wiring process.

The display driver IC device 100 may include the BVS 194-1 penetrating the second substrate 152, the second interlayer insulating layer 159, the second contact wiring layer 164, the second bonding insulating layer 162, the first bonding insulating layer 112, and the first interlayer insulating layer 109 and electrically connected to the contact wiring layer 116 of the first chip 1C. The BVS 194-1 may electrically connect the second contact wiring layer 164 of the second chip 2C to the contact wiring layer 116 of the first chip 1C.

The BVS 194-1 may include the back via hole 194a penetrating the second substrate 152, the second interlayer insulating layer 159, the second bonding insulating layer 162, the first bonding insulating layer 112, and the first interlayer insulating layer 109, the metal layer 194b formed on the inside of the back via hole 194a and on the second back surface 152b, and the passivation layer 194c embedded in the back via hole 194a on the metal layer 194b.

The display driver IC device 100 may include the connection terminal 192-1 formed on the BVS 194-1. For example, the connection terminal 192-1 may be formed on the metal layer 194b of the BVS 194-1. The connection terminal 192-1 may be electrically connected to the BVS 194-1 on the second back surface 152b. The connection terminals 192-1 may be located on both sides of the BVS 194-1. The connection terminal 192-1 may include the conductive pad 192a and the conductive bump 192b formed on the conductive pad 192a. The conductive pad 192a may include a metal pad, such as an aluminum (Al) pad. The conductive bump 192b may include a solder bump. The connection terminal 192-1 may be insulated by the passivation layer 194c. For example, a portion of the connection terminal 192-1 may be insulated by the passivation layer 194c.

FIGS. 8A to 8F are cross-sectional views for describing a method of manufacturing a display driver IC device, according to example embodiments of the inventive concept.

Specifically, FIGS. 8A to 8F are for explaining the manufacturing method of FIG. 7B described above for the sake of convenience. In FIGS. 8A to 8F, the same reference numerals as those in FIGS. 5, 6A, 6B, 7A and 7B denote the same components, and the same descriptions are briefly provided or omitted for convenience.

Figure 8A:
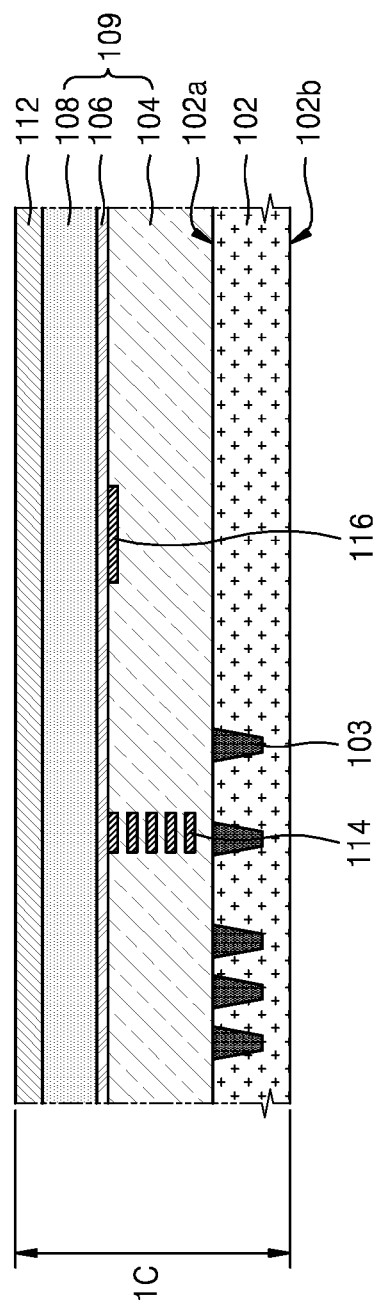
FIGS. 8A to 8F are cross-sectional views for describing a method of manufacturing a display driver IC device, according to example embodiments of the inventive concept.

Referring to FIG. 8A, FIG. 8A shows a cross-sectional view of manufacturing the first chip 1C. The first substrate 102 including the first front surface 102a and the first back surface 102b opposite to the first front surface 102a is prepared. The first substrate 102 may be provided from a wafer, such as a silicon wafer. The device isolation layer 103, the first interlayer insulating layer 109, the wiring layers 114 and 116, and the first bonding insulating layer 112 are formed on the first front surface 102a of the first substrate 102 to manufacture the first chip 1C. In addition, although not shown in FIG. 8A, the first chip 1C may include the logic circuit 140 and the first memory 150a implemented on the first substrate 102, as described above. For example, the first chip 1C may include the first substrate 102 provided with the logic circuit 140 and the first memory 150a.

Figure 8B:
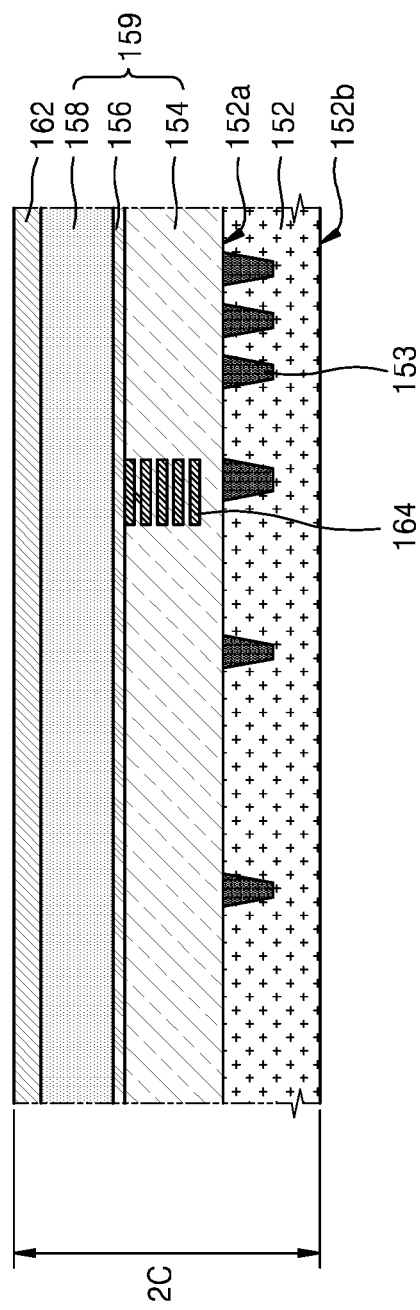

Referring to FIG. 8B, FIG. 8B shows a cross-sectional view of manufacturing the second chip 2C. The second substrate 152 having the second front surface 152a and the second back surface 152b opposite to the second front surface 152a is prepared. The second substrate 152 may be provided from a wafer, such as a silicon wafer. The device isolation layer 153, the second interlayer insulating layer 159, the second contact wiring layer 164, and the second bonding insulating layer 162 are formed on the second front surface 152a of the second substrate 152 to manufacture the second chip 2C.

In addition, although not shown in FIG. 8B, the second chip 2C may include the gate driver 120, the source driver 130, the power supplier 110, and/or the second memory 150b implemented on the second substrate 152 as described above. For example, the second chip 2C may include the second substrate 152 provided with the gate driver 120, the source driver 130, the power supplier 110, and/or the second memory 150b.

Figure 8C:
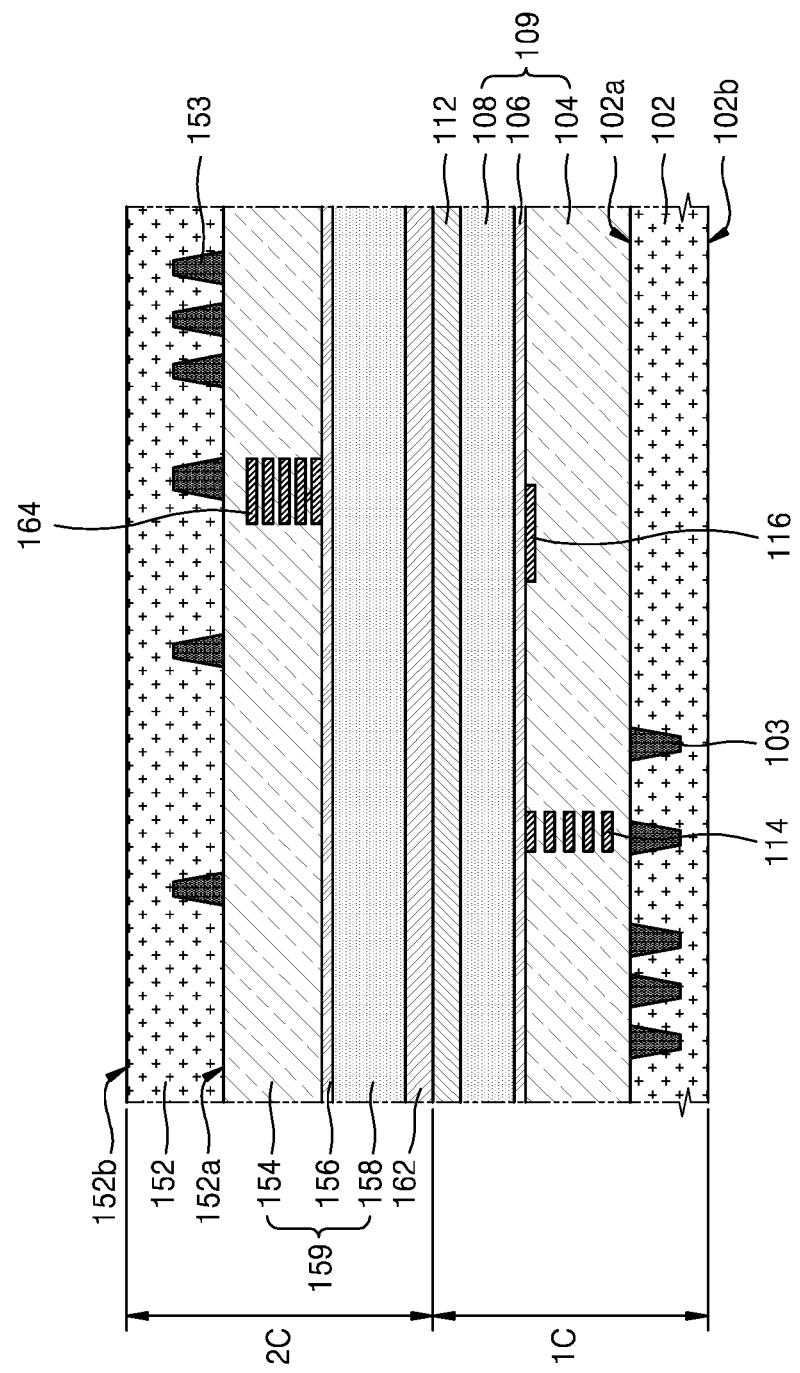

Referring to FIG. 8C, FIG. 8C shows a cross-sectional view of bonding the first chip 1C to the second chip 2C. After the first chip 1C and the second chip 2C are formed as described above, the second chip 2C is turned upside down to dispose the second bonding insulating layer 162 of the second chip 2C on the first bonding insulating layer 112 of the first chip 1C. Then, the first bonding insulating layer 112 is bonded to the second bonding insulating layer 162 through a bonding process. The bonding process may be a process of heat-treating a surface of the first bonding insulating layer 112 and a surface of the second bonding insulating layer 162 attached thereto. In some example, the bonding process may be a surface bonding process of bonding the surface of the first bonding insulating layer 112 to the surface of the second bonding insulating layer 162 to each other.

Figure 8D:
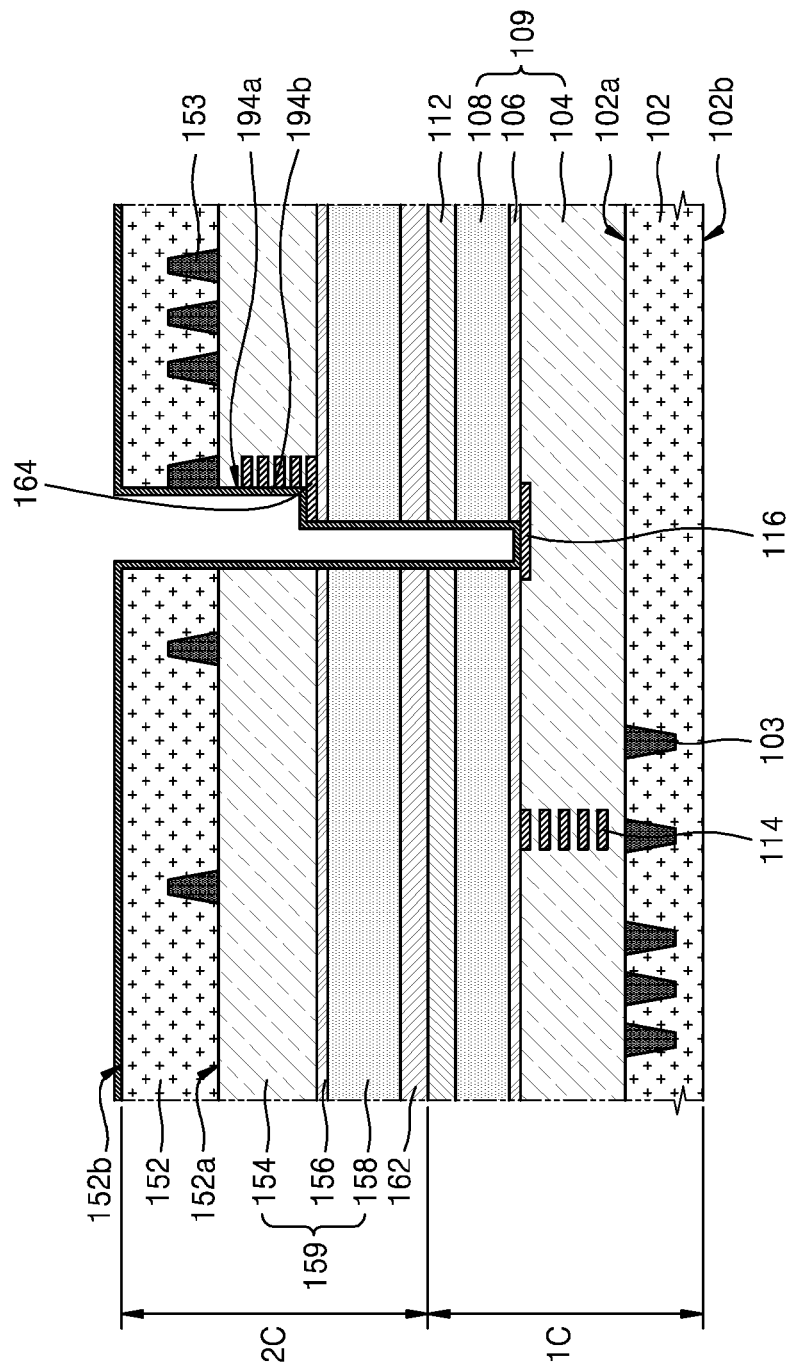
Figure 8E:
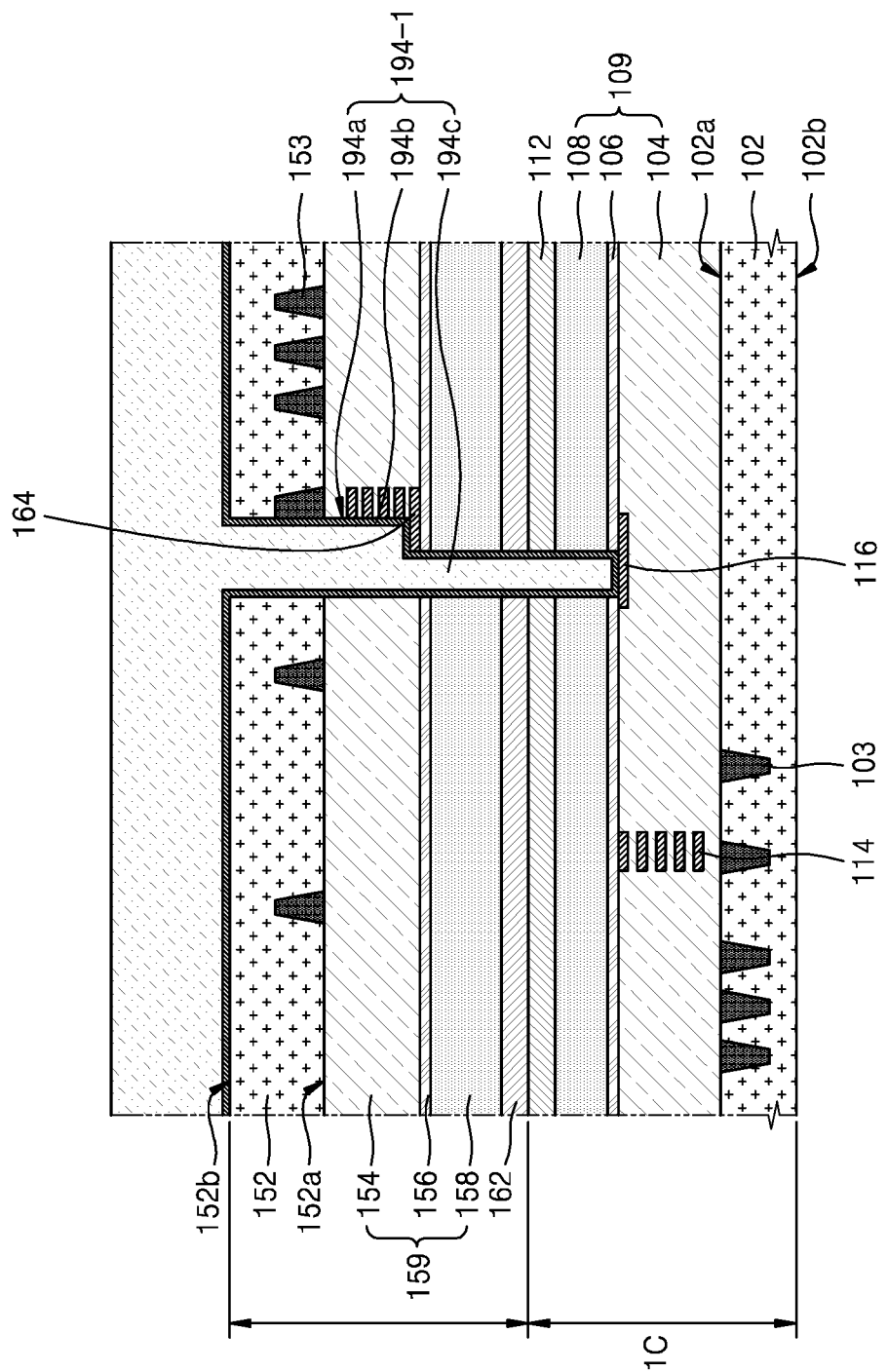

Referring to FIGS. 8D and 8E, FIGS. 8D and 8E illustrate cross-sectional views of forming the BVS 194-1. After the first chip 1C and the second chip 2C are bonded, the BVS 194-1 is formed.

As shown in FIG. 8D, the back via hole 194a penetrating the second substrate 152, the second interlayer insulating layer 159, the second contact wiring layer 164, the second bonding insulating layer 162, the first bonding insulating layer 112, and the first interlayer insulating layer 109 is formed. Then, the metal layer 194b is formed inside of the back via hole 194a and on the second back surface 152b of the second chip 2C. The back via hole 194a may be formed by an etching process, such as a dry etch. In some examples, the back via hole 194a may be formed by one-time etching such that process costs may be decreased.

As shown in FIG. 8E, the passivation layer 194c to be embedded in the back via hole 194a is formed on the metal layer 194b. Through such a process, the BVS 194-1 including the back via hole 194a, the metal layer 194b, and the passivation layer 194c is formed. The BVS 194-1 may electrically connect the second contact wiring layer 164 of the second chip 2C to the contact wiring layer 116 of the first chip 1C.

Figure 8F:
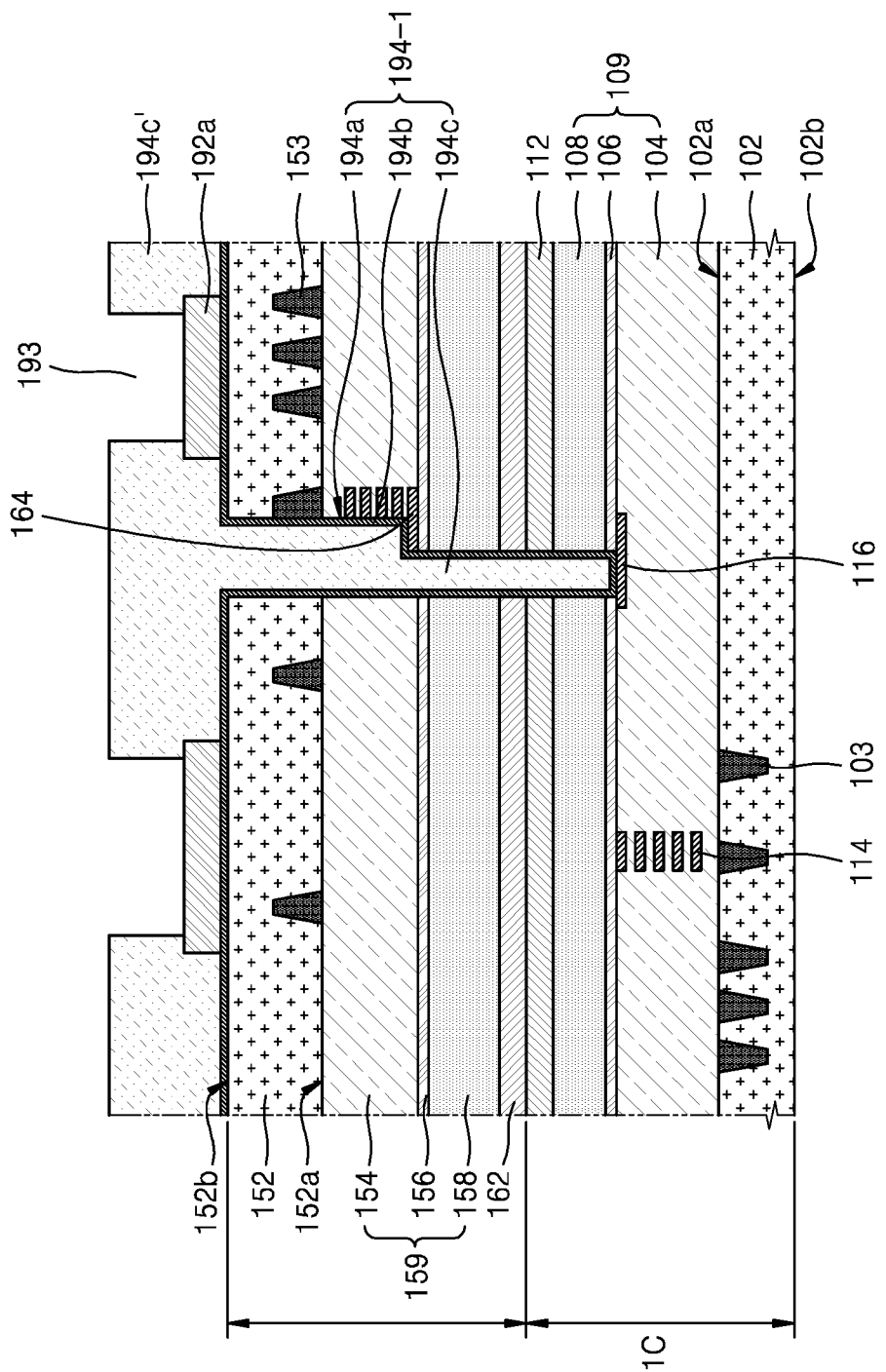

Referring to FIG. 8F, FIG. 8F shows a cross-sectional view of forming the connection terminal (192-1 in FIG. 7B). After forming the BVS 194-1, the connection terminal 192-1 is formed on the BVS 194-1.

The conductive pad 192a of the connection terminal is formed on the metal layer 194b on the back surface of the second substrate 152. An additional passivation layer 194c' to form a contact hole 193 exposing the conductive pad 192a on the metal layer 194b of the back surface of the second substrate 152 is then formed.

Subsequently, as shown in FIG. 7B, the conductive bump 192b formed on the conductive pad 192a is formed. The conductive bump 192b (e.g., a portion of the conductive bump 192b) may be insulated by the passivation layers 194c and 194c'. For example, the connection terminal 192-1 electrically connected to the BVS 194-1 is formed on the BVS 194-1 on the second back surface 152b of the second chip 2C. For example, the connection terminal 192-1 may be formed on the metal layer 194b of the BVS 194-1.

Figure 9:
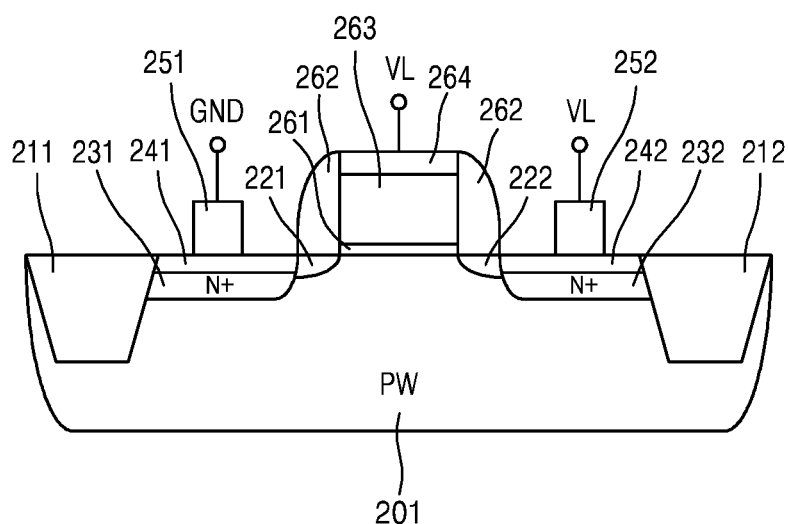
FIG. 9 is a cross-sectional view showing an embodiment of a low voltage transistor used in a display driver IC device according to the inventive concept.

FIG. 9 is a cross-sectional view showing an embodiment of a low voltage transistor 200 used in the display driver IC device 100 according to the inventive concept.

Specifically, as described above, the display driver IC device 100 of FIGS. 1 to 4 may include the low voltage transistor 200 in the logic circuit 140 and the first memory 150. The low voltage transistor 200 may be implemented on the first substrate (102 in FIGS. 6B and 7B). An example of the low voltage transistor 200 is an N-channel transistor.

The low voltage transistor 200 may include a P-type well region PW 201 and the device isolation layers 211 and 212 in the P-type well region PW 201. The device isolation layers 211 and 212 may correspond to reference numeral 103 of FIG. 6B or 7B.

A gate insulating layer 261 and a gate electrode 263 are formed on the P-type well region PW 201. Spacers 262 are formed on both side walls of the gate insulating layer 261 and the gate electrode 263. N-type LDD regions 221 and 222 are formed in the well region PW 201 below the spacer 262. An N-type source region 231 and an N-type drain region 232 are aligned with and formed on the spacers 262 and both sides of the gate electrode 263.

Silicide regions 241 and 242 are formed on the N-type source region 231 and the N-type drain region 232. A source electrode 251 and a drain electrode 252 are formed on the silicide regions 241 and 242, respectively. A gate silicide 264 is formed on the gate electrode 263. In some examples, the low voltage transistor 200 may not include the silicide regions 241 and 242 and/or the gate silicide 264.

The low voltage transistor 200 may also include a P-channel transistor (not shown). The P-channel transistor is formed in the opposite conductivity type to the N-channel transistor described above.

A ground voltage GND may be applied to the source electrode 251 of the low voltage transistor 200, and a low voltage VL, e.g. 3V or less, may be applied to the gate electrode 263 (e.g., to the silicide 264), and the drain electrode 252 of the low voltage transistor 200.

A thickness of the gate insulating layer 261 may be small of 70 Å or less, for example, 50 Å to 70 Å. The P-type well region PW 201 may be formed deeper than depths of the device isolation layers 211 and 212. The device isolation layers 211 and 212 may have a shallow trench isolation (STI) structure and may have a depth of 0.3 um to 0.5 um.

Figure 10:
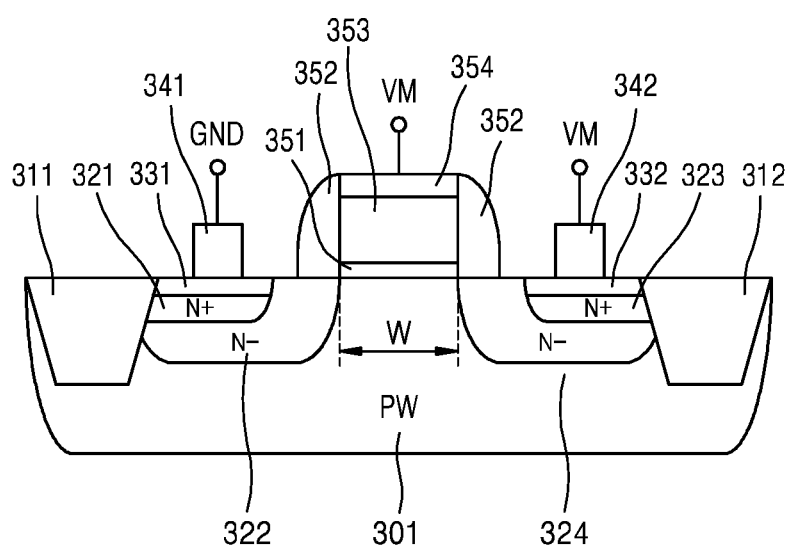
FIG. 10 is a cross-sectional view showing an embodiment of a medium voltage transistor used in a display driver IC device according to the inventive concept.

FIG. 10 is a cross-sectional view showing an embodiment of a medium voltage transistor 300 used in the display driver IC device according to the inventive concept.

Specifically, as described above, the display driver IC device 100 of FIGS. 1 to 4 may include the medium voltage transistor 300 in the source driver 130. The medium voltage transistor 300 may be implemented on the second substrate (152 in FIGS. 6B and 7B).

In the medium voltage transistor 300, device isolation layers 311 and 312 are formed in a P-type well region PW 301. A pair of low-concentration N-type drift regions 322 and 324 are formed in the well region PW 301. For example, the N-type drift regions 322 and 324 include the first drift region 322 and the second drift region 324.

An N-type source region 321 and an N-type drain region 323 are formed in the first and second drift regions 322 and 324, respectively. Silicide regions 331 and 332 are formed on the source region 321 and the drain region 323. A source electrode 341 and a drain electrode 342 are formed on the silicide regions 331 and 332, respectively. A gate insulating layer 351, a gate electrode 353, and a gate silicide 354 are formed between the source region 321 and the drain region 323. Spacers 352 are formed on both sidewalls of the gate insulating layer 351, the gate electrode 353, and the gate silicide 354. In some examples, the medium voltage transistor 300 may not include the silicide regions 331 and 332 and/or the gate silicide 354.

In FIG. 10, the source region 321 and the drain region 323 are not aligned with the spacer 352, but may be spaced apart from each other by a predetermined distance. In some examples, the source region 321 and the drain region 323 may be arranged in alignment with the spacer 352.

The ground voltage GND may be applied to the source electrode 341 of the medium voltage transistor 300, and a medium voltage VM, e.g. a voltage of more than 3 V and less than 9 V, may be applied to the gate electrode 353 and the drain electrode 342 of the medium voltage transistor 300. A thickness of the gate insulating layer 351 may have an intermediate thickness of 70 Å, for example, 70 Å to 300 Å.

Figure 11:
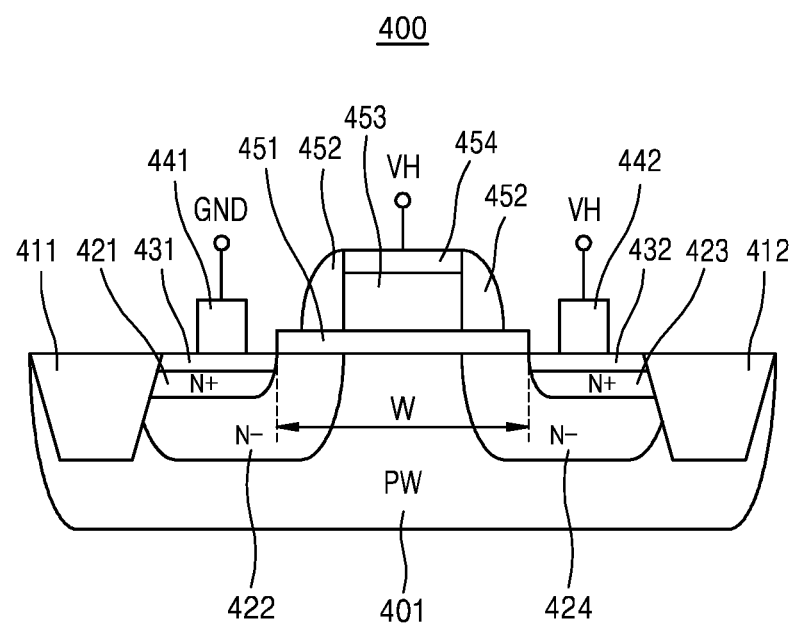
FIG. 11 is a cross-sectional view showing an embodiment of a high voltage transistor used in a display driver IC device according to the inventive concept.

FIG. 11 is a cross-sectional view showing an embodiment of a high voltage transistor 400 used in the display driver IC device 100 according to the inventive concept.

Specifically, as described above, the display driver IC device 100 (FIGS. 1 to 4) may include the high voltage transistor 400 in the power supplier 110, the gate driver 120, and the source driver 130. The high voltage transistor 400 may be implemented on the second substrate (152 in FIGS. 6B and 7B).

In the high voltage transistor 400, device isolation layers 411 and 412 are formed in a P-type well region PW 401. A pair of low concentration N type drift regions 422 and 424 are formed in the well region PW 401. For example, the N type drift regions 422 and 424 include the first drift region 422 and the second drift region 424. The N-type drift regions 422 and 424 may be formed deeper than N-type drift regions 322 and 324 in FIG. 10.

An N-type source region 421 and an N-type drain region 423 are formed in the first and second drift regions 422 and 424, respectively. Silicide regions 431 and 432 are formed on the source region 421 and the drain region 423. A source electrode 441 and a drain electrode 442 are formed on the silicide regions 431 and 432, respectively. A gate insulating layer 451, a gate electrode 453, and a gate silicide 454 are formed between the source region 421 and the drain region 423. A width (W) of the gate insulating layer 451 may be larger than that of the gate insulating layer 351 of FIG. 10. Spacers 452 are formed on both side walls of the gate electrode 453 and the gate silicide 454. In some examples, the high voltage transistor 400 may not include the silicide regions 431 and 432 and/or the gate silicide 454.

The ground voltage GND may be applied to the source electrode 441 of the high voltage transistor 400, and a high voltage VH such as 9 V to 30 V may be applied to the gate electrode 453 and the drain electrode 442 of the high voltage transistor 400. The thickness of the gate insulating layer 451 may be greater than 300 Å, for example, 300 Å to 800 Å.

Figure 12:
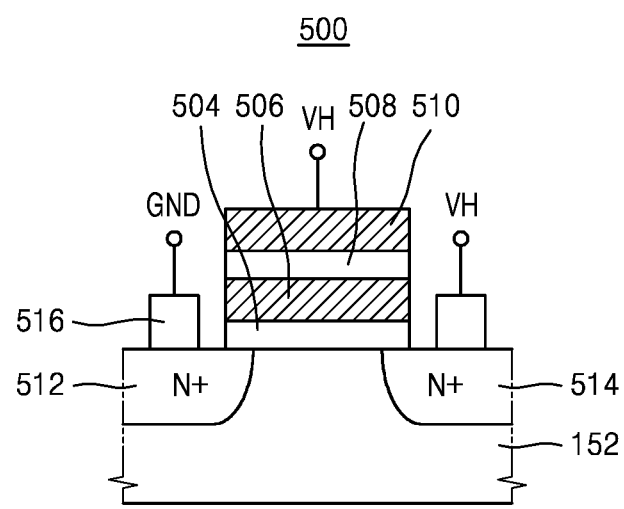
FIG. 12 is a cross-sectional view showing an embodiment of a high voltage transistor used in a display driver IC device according to the inventive concept.

FIG. 12 is a cross-sectional view showing an embodiment of a high voltage transistor 500 used in the display driver IC device according to the inventive concept.

Specifically, as described above, the display driver IC device (100 of FIGS. 1 to 4) may include the high voltage transistor 500 in the second memory 150b. The high voltage transistor 500 may be implemented on the second substrate (152 in FIGS. 6B and 7B). The high voltage transistor 500 may be a MOS transistor used in a flash memory.

An N-type source region 512 and an N-type drain region 514 are formed in the second substrate 152 so as to be spaced apart from each other. A source electrode 516 and a drain electrode 518 are formed on the source region 512 and the drain region 514, respectively. A tunnel insulating layer 504, a charge storage layer 506, a blocking insulating layer 508 and a control gate 510 (a control gate electrode) are formed on the second substrate 152 between the source region 512 and the drain region 514.

The charge storage layer 506 may be referred to as a floating gate. The tunnel insulating layer 504 and the blocking insulating layer 508 may be formed as a silicon oxide layer. The charge storage layer 506 may be formed as a silicon nitride layer. The tunnel insulating layer 504, the charge storage layer 506, and the blocking insulating layer 508 may collectively be referred to as a gate insulating layer.

The ground voltage GND may be applied to the source electrode 516 of the high voltage transistor 500 and the high voltage VH, for example, a voltage of 9 V to 30 V, may be applied to the control gate 510 and the drain electrode 518 of the high voltage transistor 500. A thickness of the gate insulating layer including the tunnel insulating layer 504, the charge storage layer 506, and the blocking insulating layer 508 may be greater than 300 Å, e.g., 300 Å to 800 Å.

Figure 13:
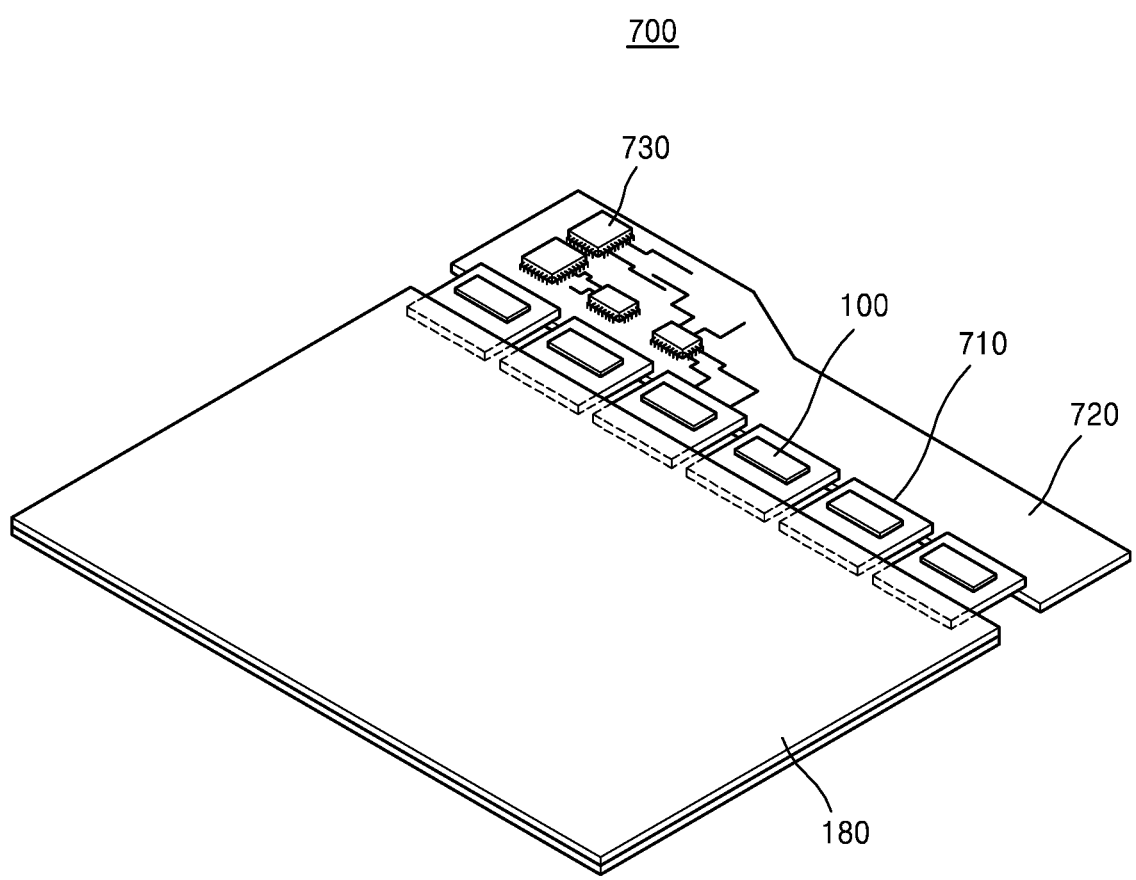
FIG. 13 is a perspective view of a display module including a display driver IC device according to an embodiment of the inventive concept.

FIG. 13 is a perspective view of a display module 700 including the display driver IC device 100 according to an embodiment of the inventive concept.

Specifically, the display module 700 may include the display driver IC device 100, a film package 710, a printed circuit board 720, and the display panel 180. The printed circuit board 720 may be connected to the film package 710. The printed circuit board 720 is mounted with electronic devices 730 that provide an electrical signal to the display driver IC device 100. The display panel 180 may be connected to the film package 710. Input and output terminals of the printed circuit board 720 and the film package 710 and input and output terminals of the film package 710 and the display panel 180 may be electrically bonded by a thermal compression bonding process.

Figure 14:
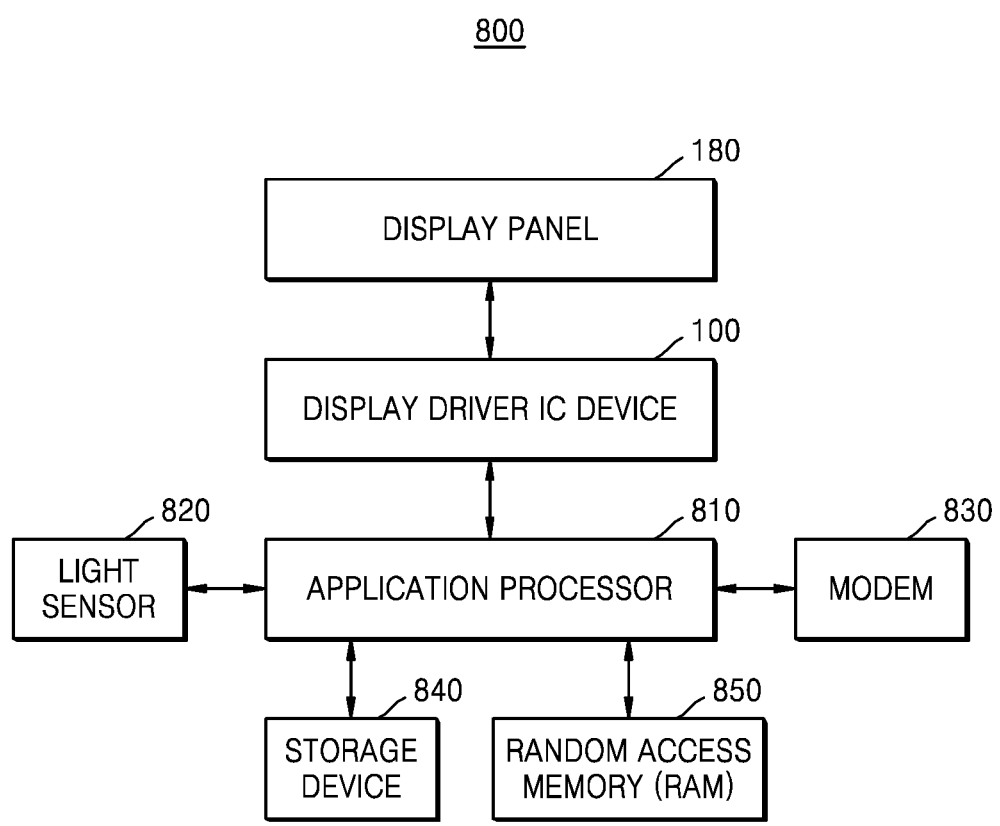
FIG. 14 is a block diagram illustrating an electronic device including a display driver IC device according to an embodiment of the inventive concept.

FIG. 14 is a block diagram illustrating an electronic device 800 including the display driver IC device 100 according to an embodiment of the inventive concept.

Specifically, the electronic device 800 may be a device including an image display function. For example, the electronic device 800 may include at least one of a smartphone, a tablet personal computer, a mobile phone, a videophone, an e-book reader, a desktop personal computer, a laptop personal computer, a netbook computer, a personal digital assistant (PDA), a portable multimedia player (PMP), an MP3 player, a mobile medical device, a camera and a wearable device, or the like. The wearable device may be a head-mounted-device (HMD) such as an electronic eyeglass, an electronic garment, an electronic bracelet, an electronic necklace, an electronic app apparel, an electronic tattoo, a smart watch, or the like.

According to an embodiment, the electronic device 800 may be a smart home appliance having an image display function. The smart home appliance may include at least one of, for example, televisions, (DVD) digital video disk players, audio, refrigerators, air conditioners, vacuum cleaners, ovens, microwaves, washing machines, air cleaners, set-top boxes, a TV box (e.g., Samsung HomeSync™, Apple TV™, or Google TV™), game consoles, electronic dictionary, electronic key, camcorder, and electronic photo frame.

According to an embodiment, the electronic device 800 may include at least one of a variety of medical devices (e.g., magnetic resonance angiography (MRA), magnetic resonance imaging (MRI), computed tomography (CT), a camera, an ultrasound device, etc.), a navigation device, a global positioning system (GPS) receiver, an event data recorder (EDR), a flight data recorder (FDR), an automotive infotainment device, a marine electronic device (e.g., a marine navigation device and a gyro compass), avionics, security devices, car head units, industrial or household robots, automatic teller's machines (ATMs) of financial institutions, or point of sale (POS) of stores.

According to an embodiment, the electronic device 800 may include at least one of a piece of furniture or a building/structure including an image display function, an electronic board, an electronic signature receiving device, a projector, or various measuring instruments (e.g., water, electricity, gas, or radio wave measuring instruments, etc.)

The electronic device 800 may include the display panel 180, the display driver IC device 100 disclosed above, an application processor 810, a light sensor 820, a modem 830, a storage device 840, and a random access memory (RAM) 850.

The display panel 180 displays an image. The display panel 180 is supplied with a voltage for displaying an image from the display driver IC device 100. The display driver IC device 100 receives image data and an image control signal for displaying an image from the application processor 810. The display driver IC device 100 may function as a controller for driving the display panel 180.

The application processor 810 may perform a control operation for controlling the electronic device 800 and a computing operation for computing various data. The application processor 810 may execute an operating system and various applications. For example, the application processor 810 may provide a low power mode command to the display driver IC device 100 to control the display driver IC device 100 to operate in a low power mode.

The light sensor 820 may include a color sensor for sensing light in a visible light band or an infrared sensor for sensing light in an infrared band. The light sensor 820 may sense light provided from outside and provide the light sensing signal to the application processor 810. In this case, the application processor 810 may calculate an illuminance value based on the light sensing signal, and may provide illuminance information to the display driver IC device 100. Alternatively, the light sensor 820 may include an illuminance sensor, and the illuminance sensor may calculate an external illuminance value and provide the light sensor 820 with a light sensing signal including illuminance information. The display driver IC device 100 may control brightness of the image displayed on the display panel 180 based on the illuminance information.

The modem 830 may communicate with an external device. The modem 830 may perform communication based on a wireless communication method or a wired communication method. The storage device 840 may be used as an auxiliary storage device of the application processor 810. For example, an operating system executed by the application processor 810 or source codes of various applications, various data generated for the purpose of long-term storage by the operating system or applications may be stored in the storage device 840. The storage device 840 may include a flash memory, a phase-change RAM (PRAM), a magnetic RAM (MRAM), a ferroelectric RAM (FeRAM), a resistive RAM (RRAM), etc.

The random access memory 850 may be used as a main memory of the application processor 810. For example, the random access memory 850 may store various data that are processed by the application processor 810 and process codes. The random access memory 850 may include a dynamic random access memory (DRAM), a static random access memory (SRAM), a phase change random access memory (PRAM), a magnetic random access memory (MRAM), a ferroelectric random access memory (FeRAM), etc.

While the inventive concept has been particularly shown and described with reference to embodiments thereof, it will be understood that various changes in form and details may be made therein without departing from the spirit and scope of the following claims.

What is claimed is:

1. A display driver integrated circuit (IC) device comprising:
   a first substrate having a first front surface and a first back surface opposite to the first front surface;
   a first interlayer insulating layer on the first front surface;
   a first wiring layer in the first interlayer insulating layer;
   a first bonding insulating layer on the first interlayer insulating layer;
   a second substrate having a second front surface and a second back surface opposite to the second front surface, the second front surface being disposed toward the first front surface;

a second interlayer insulating layer on the second front surface;

a second bonding insulating layer on the second interlayer insulating layer and physically bonded to the first bonding insulating layer;

a back via stack structure penetrating the second substrate, the second interlayer insulating layer, the second bonding insulating layer, the first bonding insulating layer, and the first interlayer insulating layer and electrically connected to the first wiring layer;

a connection terminal on the back via stack structure on the second back surface and electrically connected to the back via stack structure;

a first transistor formed on the first substrate; and a second transistor or a third transistor formed on the second substrate, wherein the display driver IC device is configured to apply a first voltage to the first transistor, and to apply either a second voltage greater than the first voltage to the second transistor or a third voltage greater than the first voltage and the second voltage to the third transistor.

2. The display driver IC device of claim 1, further comprising:

a logic circuit and a first memory formed on the first substrate, wherein the logic circuit and the first memory comprise the first transistor.

3. The display driver IC device of claim 2, further comprising:

a gate driver configured to control a gate line of a display panel;

a source driver configured to control a source line of the display panel;

a second memory; and a power supplier configured to provide the gate driver and the source driver with a voltage, wherein the gate driver, source driver, second memory and power supplier are formed on the second substrate, wherein the gate driver, the second memory, and the power supplier comprise the third transistor, and wherein the source driver comprises the second and third transistors.

4. The display driver IC device of claim 1, further comprising:

a gate driver configured to control a gate line of a display panel;

a source driver configured to control a source line of the display panel; and a power supplier configured to provide the gate driver and the source driver with a voltage, wherein the gate driver, the source driver, and the power supplier are formed on the second substrate, wherein the gate driver and the power supplier comprise the third transistor, and wherein the source driver comprises the second and third transistors.

5. The display driver IC device of claim 1, wherein the first wiring layer comprises a contact wiring layer electrically connected to the back via stack structure.

6. The display driver IC device of claim 1, further comprising:

a second wiring layer formed on the second front surface and electrically insulated by the second interlayer insulating layer, wherein the second wiring layer is electrically connected to the first wiring layer by the back via stack structure.

7. The display driver IC device of claim 1, wherein the connection terminal comprises a conductive pad and a conductive bump formed on the conductive pad, and wherein the conductive pad is formed on the back via stack structure.

8. The display driver IC device of claim 1, wherein the first substrate, the first interlayer insulating layer, the first wiring layer, and the first bonding insulating layer constitute a first chip, wherein the second substrate, the second interlayer insulating layer, and the second bonding insulating layer constitute a second chip, and wherein the first and second chips are provided from a different wafer.

9. The display driver IC device of claim 8, wherein the back via stack structure comprises a continuously and integrally formed metal layer formed inside a back via hole penetrating the second substrate, the second interlayer insulating layer, the second bonding insulating layer, the first bonding insulating layer, and the first interlayer insulating layer.

10. A display driver integrated circuit (IC) device comprising:

a first substrate having a first front surface and a first back surface opposite to the first front surface;

a first interlayer insulating layer on the first front surface;

a first wiring layer in the first interlayer insulating layer;

a first bonding insulating layer on the first interlayer insulating layer;

a second substrate having a second front surface and a second back surface opposite to the second front surface, the second front surface being disposed toward the first front surface;

a second interlayer insulating layer on the second front surface;

a second bonding insulating layer on the second interlayer insulating layer and physically bonded to the first bonding insulating layer;

a back via stack structure comprising a back via hole penetrating the second substrate, the second interlayer insulating layer, the first and second bonding insulating layers, and the first interlayer insulating layer, a metal layer inside the back via hole and on the second back surface, and a passivation layer embedded in the back via hole and electrically connected to the first wiring layer; and a connection terminal comprising a conductive pad and a conductive bump formed on the conductive pad and electrically connected to the back via stack structure, wherein the conductive pad is formed on the metal layer on the second back surface.

11. The display driver IC device of claim 10, wherein the back via hole is a via hole penetrating from the second back surface of the second substrate toward the first front surface of the first substrate.

12. The display driver IC device of claim 10, wherein a width of the back via hole at the second back surface of the second substrate is wider than a width of the back via hole at the first front surface of the first substrate.

13. The display driver IC device of claim 10, further comprising:

a second wiring layer formed on the second front surface and electrically insulated by the second interlayer insulating layer, wherein the second wiring layer is electrically connected to the first wiring layer by the back via stack structure.

14. The display driver IC device of claim 10, wherein the passivation layer is formed on a partial surface of the conductive pad and on the metal layer.

15. The display driver IC device of claim 10, further comprising:
- a first transistor formed on the first substrate; and
- a second transistor or a third transistor formed on the second substrate,
- wherein the display driver IC device is configured to apply a first voltage to a first transistor, and to apply either a second voltage greater than the first voltage to the second transistor or a third voltage greater than the first voltage and the second voltage to the third transistor.

16. A display driver integrated circuit (IC) device comprising:
- a first substrate having a first front surface and a first back surface opposite to the first front surface;
- a first interlayer insulating layer on the first front surface;
- a wiring layer in the first interlayer insulating layer;
- a second substrate having a second front surface corresponding to the first front surface and a second back surface opposite to the second front surface;
- a second interlayer insulating layer on the second front surface;
- a bonding insulating layer disposed between the first interlayer insulating layer of the first substrate and the second interlayer insulating layer of the second substrate and bonding the first substrate to the second substrate;
- a plurality of connection terminals spaced apart from each other in a flat manner on the second back surface of the second substrate; and
- a back via stack structure electrically connected to the plurality of connection terminals, vertically penetrating the second substrate, the second interlayer insulating layer, the bonding insulating layer, and the first interlayer insulating layer, and electrically connected to the wiring layer,
- wherein the back via stack structure is located adjacent to one side of one of the plurality of connection terminals.

17. The display driver IC device of claim 16, wherein, in a plan view, the plurality of connection terminals are arranged in one or two rows along an edge of the second back surface.

18. The display driver IC device of claim 17, wherein, when the plurality of connection terminals are arranged in two rows along the edge of the second back surface, the back via stack structure is disposed between two connection terminals of the plurality of connection terminals.

* * * * *